(12) United States Patent
Baxter et al.

(10) Patent No.: US 9,197,182 B2
(45) Date of Patent: Nov. 24, 2015

(54) ENVELOPE POWER SUPPLY CALIBRATION OF A MULTI-MODE RADIO FREQUENCY POWER AMPLIFIER

(71) Applicant: RF Micro Devices, Inc., Greensboro, NC (US)

(72) Inventors: Brian Baxter, Encinitas, CA (US); Jason Millard, High Point, NC (US); Roman Zbigniew Arkiszewski, Oak Ridge, NC (US); Steven Selby, Lynchburg, VA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/010,643

(22) Filed: Aug. 27, 2013

(65) Prior Publication Data

US 2013/0342270 A1 Dec. 26, 2013

Related U.S. Application Data

(62) Division of application No. 13/019,077, filed on Feb. 1, 2011, now Pat. No. 8,548,398.

(60) Provisional application No. 61/300,089, filed on Feb. 1, 2010.

(51) Int. Cl.
*H04B 1/66* (2006.01)
*H04B 1/04* (2006.01)
(Continued)

(52) U.S. Cl.
CPC ............. *H03G 99/00* (2013.01); *H03G 3/20* (2013.01); *H03G 3/3042* (2013.01); *H04B 1/62* (2013.01)

(58) Field of Classification Search
CPC ............. H03G 3/3042; H03F 3/24; H04B 2001/0416; H04B 1/0483
USPC ............. 455/102, 115.1, 127.1–127.4, 114.3, 455/115.2, 126
See application file for complete search history.

(56) References Cited

U.S. PATENT DOCUMENTS 3,735,289 A 5/1973 Bruene
4,523,155 A 6/1985 Walczak et al.
(Continued)

FOREIGN PATENT DOCUMENTS

GB 2444984 A 6/2008

OTHER PUBLICATIONS

Author Unknown , "SKY77344-21 Power Amplifier Module—Evaluation Information," Skyworks, Version 21, Feb. 16, 2010, 21 pages.

(Continued)

*Primary Examiner* — Simon Nguyen
(74) *Attorney, Agent, or Firm* — Withrow & Terranova, P.L.L.C.

(57) ABSTRACT

The present disclosure relates to envelope power supply calibration of a multi-mode RF power amplifier (PA) to ensure adequate headroom when operating using one of multiple communications modes. The communications modes may include multiple modulation modes, a half-duplex mode, a full-duplex mode, or any combination thereof. As such, each communications mode may have specific peak-to-average power and linearity requirements for the multi-mode RF PA. As a result, each communications mode may have corresponding envelope power supply headroom requirements. The calibration may include determining a saturation operating constraint based on calibration data obtained during saturated operation of the multi-mode RF PA. During operation of the multi-mode RF PA, the envelope power supply may be restricted to provide a minimum allowable magnitude based on an RF signal level of the multi-mode RF PA, the communications mode, and the saturation operating constraint to provide adequate headroom.

4 Claims, 18 Drawing Sheets

(51) Int. Cl.
  *H01Q 11/12* (2006.01)
  *H04B 17/00* (2015.01)
  *H03G 99/00* (2006.01)
  *H03G 3/30* (2006.01)
  *H03G 3/20* (2006.01)
  *H04B 1/62* (2006.01)

(56) References Cited

U.S. PATENT DOCUMENTS

| | | |
|---|---|---|
| 4,638,255 A | 1/1987 | Penney |
| 4,819,081 A | 4/1989 | Volk et al. |
| 5,212,459 A | 5/1993 | Ueda et al. |
| 5,278,994 A | 1/1994 | Black et al. |
| 5,307,512 A | 4/1994 | Mitzlaff |
| 5,343,307 A | 8/1994 | Mizuno et al. |
| 5,404,547 A | 4/1995 | Diamantstein et al. |
| 5,432,473 A | 7/1995 | Mattila et al. |
| 5,603,106 A | 2/1997 | Toda |
| 5,636,114 A | 6/1997 | Bhagwat et al. |
| 5,640,686 A | 6/1997 | Norimatsu |
| 5,642,075 A | 6/1997 | Bell |
| 5,652,547 A | 7/1997 | Mokhtar et al. |
| 5,724,004 A | 3/1998 | Reif et al. |
| 5,832,373 A | 11/1998 | Nakanishi et al. |
| 5,841,319 A | 11/1998 | Sato |
| 5,852,632 A | 12/1998 | Capici et al. |
| 5,860,080 A | 1/1999 | James et al. |
| 5,872,481 A | 2/1999 | Sevic et al. |
| 5,874,841 A | 2/1999 | Majid et al. |
| 5,920,808 A | 7/1999 | Jones et al. |
| 5,923,153 A | 7/1999 | Liu |
| 5,923,761 A | 7/1999 | Lodenius |
| 5,945,870 A | 8/1999 | Chu et al. |
| 5,956,246 A | 9/1999 | Sequeira et al. |
| 6,051,963 A | 4/2000 | Eagar |
| 6,064,272 A | 5/2000 | Rhee |
| 6,151,509 A | 11/2000 | Chorey |
| 6,192,225 B1 | 2/2001 | Arpaia et al. |
| 6,194,968 B1 | 2/2001 | Winslow |
| 6,229,366 B1 | 5/2001 | Balakirshnan et al. |
| 6,259,901 B1 | 7/2001 | Shinomiya et al. |
| 6,304,748 B1 | 10/2001 | Li et al. |
| 6,425,107 B1 | 7/2002 | Caldara et al. |
| 6,559,492 B1 | 5/2003 | Hazucha et al. |
| 6,606,483 B1 | 8/2003 | Baker et al. |
| 6,670,849 B1 | 12/2003 | Damgaard et al. |
| 6,674,789 B1 | 1/2004 | Fardoun et al. |
| 6,724,252 B2 | 4/2004 | Ngo et al. |
| 6,774,508 B2 | 8/2004 | Ballantyne et al. |
| 6,794,923 B2 | 9/2004 | Burt et al. |
| 6,806,768 B2 | 10/2004 | Klaren et al. |
| 6,853,244 B2 | 2/2005 | Robinson et al. |
| 6,888,482 B1 | 5/2005 | Hertle |
| 6,900,697 B1 | 5/2005 | Doyle et al. |
| 6,906,590 B2 | 6/2005 | Amano |
| 6,917,188 B2 | 7/2005 | Kernahan |
| 6,937,487 B1 | 8/2005 | Bron |
| 6,954,623 B2 | 10/2005 | Chang et al. |
| 6,969,978 B2 | 11/2005 | Dening |
| 6,998,914 B2 | 2/2006 | Robinson |
| 7,035,069 B2 | 4/2006 | Takikawa et al. |
| 7,043,213 B2 | 5/2006 | Robinson et al. |
| 7,058,374 B2 | 6/2006 | Levesque et al. |
| 7,072,626 B2 | 7/2006 | Hadjichristos |
| 7,075,346 B1 | 7/2006 | Hariman et al. |
| 7,098,728 B1 | 8/2006 | Mei et al. |
| 7,116,949 B2 | 10/2006 | Irie et al. |
| 7,145,385 B2 | 12/2006 | Brandt et al. |
| 7,148,749 B2 | 12/2006 | Rahman et al. |
| 7,154,336 B2 | 12/2006 | Maeda |
| 7,155,251 B2 | 12/2006 | Saruwatari et al. |
| 7,177,607 B2 | 2/2007 | Weiss |
| 7,180,373 B2 | 2/2007 | Imai et al. |
| 7,184,731 B2 | 2/2007 | Kim |
| 7,184,749 B2 | 2/2007 | Marsh et al. |
| 7,187,910 B2 | 3/2007 | Kim et al. |
| 7,202,734 B1 | 4/2007 | Raab |
| 7,248,111 B1 | 7/2007 | Xu et al. |
| 7,263,337 B2 | 8/2007 | Struble |
| 7,276,960 B2 | 10/2007 | Peschke |
| 7,295,814 B2 | 11/2007 | Yamashita et al. |
| 7,298,600 B2 | 11/2007 | Takikawa et al. |
| 7,299,015 B2 | 11/2007 | Iwamiya et al. |
| 7,324,787 B2 | 1/2008 | Kurakami et al. |
| 7,333,564 B2 | 2/2008 | Sugiyama et al. |
| 7,333,778 B2 * | 2/2008 | Pehlke et al. ............ 455/114.3 |
| 7,342,455 B2 | 3/2008 | Behzad et al. |
| 7,358,807 B2 | 4/2008 | Scuderi et al. |
| 7,368,985 B2 | 5/2008 | Kusunoki |
| 7,372,333 B2 | 5/2008 | Abedinpour et al. |
| 7,408,330 B2 | 8/2008 | Zhao |
| 7,477,106 B2 | 1/2009 | Van Bezooijen et al. |
| 7,483,678 B2 | 1/2009 | Rozenblit et al. |
| 7,518,448 B1 | 4/2009 | Blair et al. |
| 7,529,523 B1 | 5/2009 | Young et al. |
| 7,539,462 B2 | 5/2009 | Peckham et al. |
| 7,551,688 B2 | 6/2009 | Matero et al. |
| 7,554,407 B2 | 6/2009 | Hau et al. |
| 7,558,539 B2 | 7/2009 | Huynh et al. |
| 7,580,443 B2 | 8/2009 | Uemura et al. |
| 7,622,900 B2 | 11/2009 | Komiya |
| 7,664,520 B2 | 2/2010 | Gu |
| 7,667,987 B2 | 2/2010 | Huynh et al. |
| 7,684,220 B2 | 3/2010 | Fang et al. |
| 7,689,182 B1 | 3/2010 | Bosley et al. |
| 7,701,290 B2 | 4/2010 | Liu |
| 7,702,300 B1 | 4/2010 | McCune |
| 7,706,756 B2 | 4/2010 | Sato et al. |
| 7,714,546 B2 | 5/2010 | Kimura et al. |
| 7,724,097 B2 | 5/2010 | Carley et al. |
| 7,768,354 B2 | 8/2010 | Matsuda et al. |
| 7,782,141 B2 | 8/2010 | Witmer et al. |
| 7,783,272 B2 | 8/2010 | Magnusen |
| 7,787,570 B2 | 8/2010 | Rozenblit et al. |
| 7,796,410 B2 | 9/2010 | Takayanagi et al. |
| 7,859,511 B2 | 12/2010 | Shen et al. |
| 7,860,466 B2 | 12/2010 | Woo et al. |
| 7,876,159 B2 | 1/2011 | Wang et al. |
| 7,907,430 B2 | 3/2011 | Kularatna et al. |
| 7,941,110 B2 | 5/2011 | Gonzalez |
| 7,995,984 B2 | 8/2011 | Kudaishi et al. |
| 7,999,484 B2 | 8/2011 | Jurngwirth et al. |
| 8,000,117 B2 | 8/2011 | Petricek |
| 8,008,970 B1 | 8/2011 | Homol et al. |
| 8,023,995 B2 | 9/2011 | Kuriyama et al. |
| 8,031,003 B2 | 10/2011 | Dishop |
| 8,085,106 B2 | 12/2011 | Huda et al. |
| 8,089,323 B2 | 1/2012 | Tarng et al. |
| 8,098,093 B1 | 1/2012 | Li |
| 8,131,234 B2 | 3/2012 | Liang et al. |
| 8,134,410 B1 | 3/2012 | Zortea |
| 8,149,050 B2 | 4/2012 | Cabanillas |
| 8,149,061 B2 | 4/2012 | Schuurmans |
| 8,213,888 B2 | 7/2012 | Kuriyama et al. |
| 8,228,122 B1 | 7/2012 | Yuen et al. |
| 8,258,875 B1 | 9/2012 | Smith et al. |
| 8,271,028 B2 | 9/2012 | Rabjohn |
| 8,427,120 B1 | 4/2013 | Cilio |
| 8,461,921 B2 | 6/2013 | Pletcher et al. |
| 8,508,299 B2 | 8/2013 | Kawano et al. |
| 8,514,025 B2 | 8/2013 | Lesso |
| 8,546,980 B2 | 10/2013 | Shimamoto et al. |
| 8,564,366 B2 | 10/2013 | Namie et al. |
| 8,649,741 B2 | 2/2014 | Iijima et al. |
| 2002/0055376 A1 | 5/2002 | Norimatsu |
| 2002/0055378 A1 | 5/2002 | Imel et al. |
| 2003/0006845 A1 | 1/2003 | Lopez et al. |
| 2003/0042885 A1 | 3/2003 | Zhou et al. |
| 2003/0073418 A1 | 4/2003 | Dening et al. |
| 2003/0087626 A1 | 5/2003 | Prikhodko et al. |
| 2003/0201674 A1 | 10/2003 | Droppo et al. |
| 2003/0201834 A1 | 10/2003 | Pehlke |
| 2003/0227280 A1 | 12/2003 | Vinciarelli |

(56) References Cited

U.S. PATENT DOCUMENTS

| | | |
|---|---|---|
| 2004/0068673 A1 | 4/2004 | Espinoza-Ibarra et al. |
| 2004/0090802 A1 | 5/2004 | Pourseyed et al. |
| 2004/0095118 A1 | 5/2004 | Kernahan |
| 2004/0127173 A1 | 7/2004 | Leizerovich |
| 2004/0183507 A1 | 9/2004 | Amei |
| 2004/0185805 A1 | 9/2004 | Kim et al. |
| 2004/0192369 A1 | 9/2004 | Nilsson |
| 2004/0222848 A1 | 11/2004 | Shih et al. |
| 2004/0235438 A1 | 11/2004 | Quilisch et al. |
| 2005/0003855 A1 | 1/2005 | Wada et al. |
| 2005/0017787 A1 | 1/2005 | Kojima |
| 2005/0046507 A1* | 3/2005 | Dent ............................ 332/103 |
| 2005/0064830 A1 | 3/2005 | Grigore |
| 2005/0083715 A1 | 4/2005 | Guillarme et al. |
| 2005/0088237 A1 | 4/2005 | Gamero et al. |
| 2005/0110559 A1 | 5/2005 | Farkas et al. |
| 2005/0134388 A1 | 6/2005 | Jenkins |
| 2005/0136854 A1 | 6/2005 | Akizuki et al. |
| 2005/0136866 A1 | 6/2005 | Dupuis |
| 2005/0168281 A1 | 8/2005 | Nagamori et al. |
| 2005/0200407 A1 | 9/2005 | Arai et al. |
| 2005/0227644 A1* | 10/2005 | Maslennikov et al. ..... 455/127.1 |
| 2005/0245214 A1 | 11/2005 | Nakamura et al. |
| 2005/0280471 A1 | 12/2005 | Matsushita et al. |
| 2005/0288052 A1 | 12/2005 | Carter et al. |
| 2005/0289375 A1 | 12/2005 | Ranganathan et al. |
| 2006/0006943 A1* | 1/2006 | Clifton et al. ................. 330/285 |
| 2006/0017426 A1 | 1/2006 | Yang et al. |
| 2006/0038710 A1 | 2/2006 | Staszewski et al. |
| 2006/0046666 A1* | 3/2006 | Hara et al. ................. 455/127.1 |
| 2006/0046668 A1 | 3/2006 | Uratani et al. |
| 2006/0052065 A1 | 3/2006 | Argaman et al. |
| 2006/0067425 A1 | 3/2006 | Windisch |
| 2006/0067426 A1 | 3/2006 | Maltsev et al. |
| 2006/0084398 A1 | 4/2006 | Chmiel et al. |
| 2006/0114075 A1 | 6/2006 | Janosevic et al. |
| 2006/0119331 A1 | 6/2006 | Jacobs et al. |
| 2006/0146956 A1 | 7/2006 | Kim et al. |
| 2006/0199553 A1 | 9/2006 | Kenington |
| 2006/0221646 A1 | 10/2006 | Ye et al. |
| 2006/0226909 A1 | 10/2006 | Abedinpour et al. |
| 2006/0290444 A1 | 12/2006 | Chen |
| 2006/0293005 A1 | 12/2006 | Hara et al. |
| 2007/0024360 A1 | 2/2007 | Markowski |
| 2007/0026824 A1 | 2/2007 | Ono et al. |
| 2007/0032201 A1 | 2/2007 | Behzad et al. |
| 2007/0069820 A1 | 3/2007 | Hayata et al. |
| 2007/0096806 A1 | 5/2007 | Sorrells et al. |
| 2007/0096810 A1 | 5/2007 | Hageman et al. |
| 2007/0129025 A1 | 6/2007 | Vasa et al. |
| 2007/0146090 A1 | 6/2007 | Carey et al. |
| 2007/0182490 A1 | 8/2007 | Hau et al. |
| 2007/0210776 A1 | 9/2007 | Oka |
| 2007/0222520 A1 | 9/2007 | Inamori et al. |
| 2007/0249300 A1 | 10/2007 | Sorrells et al. |
| 2007/0249304 A1 | 10/2007 | Snelgrove et al. |
| 2007/0279021 A1 | 12/2007 | Yanagida et al. |
| 2007/0281635 A1 | 12/2007 | McCallister et al. |
| 2007/0291873 A1 | 12/2007 | Saito et al. |
| 2008/0003950 A1 | 1/2008 | Haapoja et al. |
| 2008/0008273 A1 | 1/2008 | Kim et al. |
| 2008/0009248 A1 | 1/2008 | Rozenblit et al. |
| 2008/0023825 A1 | 1/2008 | Hebert et al. |
| 2008/0036532 A1 | 2/2008 | Pan |
| 2008/0051044 A1 | 2/2008 | Takehara |
| 2008/0057883 A1 | 3/2008 | Pan |
| 2008/0081572 A1 | 4/2008 | Rofougaran |
| 2008/0136559 A1 | 6/2008 | Takahashi et al. |
| 2008/0157732 A1 | 7/2008 | Williams |
| 2008/0169792 A1 | 7/2008 | Orr |
| 2008/0205547 A1 | 8/2008 | Rofougaran |
| 2008/0233913 A1 | 9/2008 | Sivasubramaniam |
| 2008/0278136 A1 | 11/2008 | Murtojarvi |
| 2008/0278236 A1 | 11/2008 | Seymour |
| 2009/0004981 A1 | 1/2009 | Eliezer et al. |
| 2009/0011787 A1 | 1/2009 | Kikuma |
| 2009/0021302 A1 | 1/2009 | Elia |
| 2009/0059630 A1 | 3/2009 | Williams |
| 2009/0068966 A1 | 3/2009 | Drogi et al. |
| 2009/0104900 A1 | 4/2009 | Lee |
| 2009/0115520 A1 | 5/2009 | Ripley et al. |
| 2009/0153250 A1 | 6/2009 | Rofougaran |
| 2009/0163153 A1* | 6/2009 | Senda et al. ................. 455/101 |
| 2009/0163157 A1 | 6/2009 | Zolfaghari |
| 2009/0176464 A1* | 7/2009 | Liang et al. .................... 455/102 |
| 2009/0191826 A1 | 7/2009 | Takinami et al. |
| 2009/0258611 A1* | 10/2009 | Nakamura et al. ............. 455/108 |
| 2009/0264091 A1 | 10/2009 | Jensen et al. |
| 2009/0274207 A1 | 11/2009 | O'Keeffe et al. |
| 2009/0285331 A1 | 11/2009 | Sugar et al. |
| 2009/0289719 A1 | 11/2009 | Van Bezooijen et al. |
| 2009/0311980 A1 | 12/2009 | Sjoland |
| 2009/0322304 A1 | 12/2009 | Oraw et al. |
| 2010/0007412 A1* | 1/2010 | Wang et al. ............... 330/124 R |
| 2010/0007414 A1 | 1/2010 | Searle et al. |
| 2010/0007433 A1 | 1/2010 | Jensen |
| 2010/0013548 A1 | 1/2010 | Barrow |
| 2010/0020899 A1 | 1/2010 | Szopko et al. |
| 2010/0027596 A1 | 2/2010 | Bellaouar et al. |
| 2010/0029224 A1 | 2/2010 | Urushihara et al. |
| 2010/0052794 A1 | 3/2010 | Rofougaran |
| 2010/0097104 A1 | 4/2010 | Yang et al. |
| 2010/0102789 A1 | 4/2010 | Randall |
| 2010/0109561 A1 | 5/2010 | Chen et al. |
| 2010/0120384 A1 | 5/2010 | Pennec |
| 2010/0120475 A1 | 5/2010 | Taniuchi et al. |
| 2010/0123447 A1 | 5/2010 | Vecera et al. |
| 2010/0127781 A1 | 5/2010 | Inamori et al. |
| 2010/0128689 A1 | 5/2010 | Yoon et al. |
| 2010/0164579 A1 | 7/2010 | Acatrinei |
| 2010/0176869 A1 | 7/2010 | Horie et al. |
| 2010/0181980 A1 | 7/2010 | Richardson |
| 2010/0189042 A1 | 7/2010 | Pan |
| 2010/0222015 A1 | 9/2010 | Shimizu et al. |
| 2010/0233977 A1 | 9/2010 | Minnis et al. |
| 2010/0237944 A1 | 9/2010 | Pierdomenico et al. |
| 2010/0244788 A1 | 9/2010 | Chen |
| 2010/0273535 A1 | 10/2010 | Inamori et al. |
| 2010/0291888 A1 | 11/2010 | Hadjichristos et al. |
| 2010/0295599 A1 | 11/2010 | Uehara et al. |
| 2010/0311362 A1 | 12/2010 | Lee et al. |
| 2011/0018516 A1 | 1/2011 | Notman et al. |
| 2011/0018632 A1 | 1/2011 | Pletcher et al. |
| 2011/0018640 A1 | 1/2011 | Liang et al. |
| 2011/0032030 A1* | 2/2011 | Ripley et al. ..................... 330/96 |
| 2011/0051842 A1* | 3/2011 | van der Heijden et al. ... 375/295 |
| 2011/0068768 A1 | 3/2011 | Chen et al. |
| 2011/0068873 A1* | 3/2011 | Alidio et al. .................. 330/295 |
| 2011/0075772 A1* | 3/2011 | Sethi et al. ..................... 375/345 |
| 2011/0080205 A1 | 4/2011 | Lee |
| 2011/0095735 A1 | 4/2011 | Lin |
| 2011/0123048 A1 | 5/2011 | Wang et al. |
| 2011/0136452 A1* | 6/2011 | Pratt et al. .................. 455/127.1 |
| 2011/0181115 A1 | 7/2011 | Ivanov |
| 2011/0234187 A1 | 9/2011 | Brown et al. |
| 2011/0273152 A1 | 11/2011 | Weir |
| 2011/0294445 A1 | 12/2011 | Goto et al. |
| 2011/0298538 A1 | 12/2011 | Andrys et al. |
| 2011/0309884 A1 | 12/2011 | Dishop |
| 2011/0312287 A1 | 12/2011 | Ramachandran et al. |
| 2012/0044022 A1 | 2/2012 | Walker et al. |
| 2012/0064953 A1 | 3/2012 | Dagher et al. |
| 2012/0182086 A1 | 7/2012 | Hase et al. |
| 2012/0223773 A1 | 9/2012 | Jones et al. |
| 2012/0229210 A1 | 9/2012 | Jones et al. |
| 2012/0235736 A1 | 9/2012 | Levesque et al. |
| 2012/0236958 A1 | 9/2012 | Deng et al. |
| 2012/0242413 A1 | 9/2012 | Lesso |
| 2012/0252382 A1 | 10/2012 | Bashir et al. |
| 2013/0005286 A1 | 1/2013 | Chan et al. |
| 2013/0307616 A1 | 11/2013 | Berchtold et al. |
| 2013/0344828 A1 | 12/2013 | Baxter et al. |

(56) References Cited

U.S. PATENT DOCUMENTS

2013/0344833 A1    12/2013    Baxter et al.
2014/0119070 A1    5/2014    Jeong et al.

OTHER PUBLICATIONS

Author Unknown, "60mA, 5.0V, Buck/Boost Charge Pump in ThinSOT-23 and ThinQFN", Texas Instruments Incorporated, REG710, SBAS221F, Dec. 2001, revised Mar. 2008, 23 pages.
Author Unknown, "DC-to-DC Converter Combats EMI," Maxim Integrated Products, Application Note 1077, May 28, 2002, 4 pages, http://www.maxim-ic.com/an1077/.
Author Unknown, "MIPI Alliance Specification for RF Front-End Control Interface", Mobile Industry Processor Interface (MIPI) Alliance, Version 1.00.00, May 3, 2010, approved Jul. 16, 2010, 88 pages.
Author Unknown, "SKY77344-21 Power Amplifier Module—Evaluation Information," Skyworks Solutions, Inc., Version-21, Feb. 16, 2010, 21 pages.
Bastida, E.M. et al., "Cascadable Monolithic Balanced Amplifiers at Microwave Frequencies," 10th European Microwave Conference, Sep. 8-12, 1980, pp. 603-607.
Berretta, G. et al., "A balanced CDMA2000 SiGe HBT load insensitive power amplifier," 2006 IEEE Radio and Wireless Symposium, Jan. 17-19, 2006, pp. 523-526.
Grebennikov, A. et al., "High-Efficiency Balanced Switched-Path Monolithic SiGe HBT Power Amplifiers for Wireless Applications," Proceedings of the 2nd European Microwave Integrated Circuits Conference, Oct. 8-10, 2007, pp. 391-394.
Grebennikov, A., "Circuit Design Technique for High Efficiency Class F Amplifiers," 2000 IEEE International Microwave Symposium Digest, vol. 2, Jun. 11-16, 2000, pp. 771-774.
Kurokawa, K., "Design Theory of Balanced Transistor Amplifiers," Bell System Technical Journal, vol. 44, Oct. 1965, pp. 1675-1698, Bell Labs.
Li, Y. et al., "LTE power amplifier module design: challenges and trends," IEEE International Conference on Solid-State and Integrated Circuit Technology, Nov. 2010, pp. 192-195.
Mandeep, J.S. et al., "A Compact, Balanced Low Noise Amplifier for WiMAX Base Station Applications", Microwave Journal, vol. 53, No. 11, Nov. 2010, p. 84-92.
Noriega, Fernando et al., "Designing LC Wilkinson power splitters," RF interconnects/interfaces, Aug. 2002, pp. 18, 20, 22, and 24, www.rfdesign.com.
Pampichai, Samphan et al., "A 3-dB Lumped-Distributed Miniaturized Wilkinson Divider," Electrical Engineering Conference (EECON-23), Nov. 2000, pp. 329-332.
Podcameni, A.B. et al., "An Amplifier Linearization Method Based on a Quadrature Balanced Structure," IEEE Transactions on Broadcasting, vol. 48, No. 2, Jun. 2002, p. 158-162.
Scuderi, A. et al., "Balanced SiGe PA Module for Multi-Band and Multi-Mode Cellular-Phone Applications," Digest of Technical Papers, 2008 IEEE International Solid-State Circuits Conference, Feb. 3-7, 2008, pp. 572-573, 637.
Wang, P. et al., "A 2.4-GHz +25dBm P-1dB Linear Power Amplifier with Dynamic Bias Control in a 65-nm CMOS Process," 2008 European Solid-State Circuits Conference, Sep. 15-19, 2008, pp. 490-493.
Zhang, G. et al., "A High Performance Balanced Power Amplifier and Its Integration into a Front-end Module at PCS Band," 2007 IEEE Radio Frequency Integrated Circuits Symposium, Jun. 3-5, 2007, p. 251-254.
Zhang, G. et al., "Dual Mode Efficiency Enhanced Linear Power Amplifiers Using a New Balanced Structure," 2009 IEEE Radio Frequency Integrated Circuits Symposium, Jun. 7-9, 2009, pp. 245-248.
Non-Final Office Action for U.S. Appl. No. 11/756,909, mailed May 15, 2009, 11 pages.
Final Office Action for U.S. Appl. No. 11/756,909, mailed Nov. 18, 2009, 14 pages.
Notice of Allowance for U.S. Appl. No. 11/756,909, mailed Dec. 23, 2010, 7 pages.
Non-Final Office Action for U.S. Appl. No. 12/433,377, mailed Jun. 16, 2011, 7 pages.
Notice of Allowance for U.S. Appl. No. 12/433,377, mailed Oct. 31, 2011, 8 pages.
Non-Final Office Action for U.S. Appl. No. 12/567,318, mailed May 29, 2012, 7 pages.
Final Office Action for U.S. Appl. No. 12/567,318, mailed Oct. 22, 2012, 7 pages.
Non-Final Office Action for U.S. Appl. No. 12/567,318, mailed Apr. 2, 2013, 5 pages.
Final Office Action for U.S. Appl. No. 12/567,318, mailed Jul. 19, 2013, 7 pages.
Advisory Action for U.S. Appl. No. 12/567,318, mailed Aug. 27, 2013, 3 pages.
Non-Final Office Action for U.S. Appl. No. 12/567,318, mailed Oct. 24, 2013, 6 pages.
Non-Final Office Action for U.S. Appl. No. 12/723,738, mailed Dec. 20, 2012, 7 pages.
Non-Final Office Action for U.S. Appl. No. 12/774,155, mailed Jun. 21, 2012, 18 pages.
Final Office Action for U.S. Appl. No. 12/774,155, mailed Jan. 31, 2013, 15 pages.
Final Office Action for U.S. Appl. No. 12/774,155, mailed Apr. 18, 2013, 15 pages.
Advisory Action for U.S. Appl. No. 12/774,155, mailed Jun. 4, 2013, 3 pages.
Non-Final Office Action for U.S. Appl. No. 12/774,155, mailed Aug. 15, 2013, 15 pages.
Non-Final Office Action for U.S. Appl. No. 12/749,091, mailed Mar. 25, 2013, 9 pages.
Notice of Allowance for U.S. Appl. No. 12/749,091, mailed May 20, 2013, 9 pages.
Notice of Allowance for U.S. Appl. No. 12/773,292, mailed Feb. 22, 2012, 11 pages.
Notice of Allowance for U.S. Appl. No. 12/773,292, mailed Jul. 16, 2012, 12 pages.
Quayle Action for U.S. Appl. No. 13/198,074, mailed Jan. 22, 2013, 5 pages.
Notice of Allowance for U.S. Appl. No. 13/198,074, mailed Apr. 12, 2013, 8 pages.
Notice of Allowance for U.S. Appl. No. 13/090,663, mailed Nov. 28, 2012, 8 pages.
Non-Final Office Action for U.S. Appl. No. 13/019,077, mailed Feb. 19, 2013, 9 pages.
Notice of Allowance for U.S. Appl. No. 13/019,077, mailed May 24, 2013, 9 pages.
Invitation to Pay Additional Fees and, Where Applicable, Protest Fee for PCT/US2011/050633, mailed Aug. 22, 2012, 5 pages.
International Search Report and Written Opinion for PCT/US2011/050633, mailed Mar. 8, 2013, 23 pages.
International Preliminary Report on Patentability for PCT/US2011/050633, mailed Mar. 28, 2013, 17 pages.
Non-Final Office Action for U.S. Appl. No. 13/289,134, mailed Feb. 6, 2013, 13 pages.
Notice of Allowance for U.S. Appl. No. 13/289,134, mailed Jun. 6, 2013, 8 pages.
Non-Final Office Action for U.S. Appl. No. 12/774,155, mailed Dec. 4, 2013, 18 pages.
Final Office Action for U.S. Appl. No. 13/287,713, mailed Dec. 6, 2013, 9 pages.
Notice of Allowance for U.S. Appl. No. 13/288,478, mailed Nov. 18, 2013, 9 pages.
Non-Final Office Action for U.S. Appl. No. 13/288,517, mailed Oct. 31, 2013, 10 pages.
Non-Final Office Action for U.S. Appl. No. 13/288,373, mailed Nov. 19, 2013, 5 pages.
Non-Final Office Action for U.S. Appl. No. 13/288,590, mailed Dec. 5, 2013, 8 pages.
Notice of Allowance for U.S. Appl. No. 13/304,735, mailed Jan. 2, 2014, 8 pages.
Notice of Allowance for U.S. Appl. No. 13/304,796, mailed Dec. 5, 2013, 9 pages.

(56) References Cited

OTHER PUBLICATIONS

Notice of Allowance for U.S. Appl. No. 13/304,943, mailed Dec. 5, 2013, 9 pages.
Advisory Action for U.S. Appl. No. 13/226,814, mailed Dec. 31, 2013, 3 pages.
Final Office Action for U.S. Appl. No. 13/479,816, mailed Nov. 1, 2013, 15 pages.
Advisory Action for U.S. Appl. No. 13/479,816, mailed Jan. 7, 2014, 3 pages.
Non-Final Office Action for U.S. Appl. No. 13/656,997, mailed Jan. 13, 2014, 6 pages.
Notice of Allowance for U.S. Appl. No. 12/567,318, mailed Feb. 18, 2014, 8 pages.
Non-Final Office Action for U.S. Appl. No. 12/723,738, mailed Apr. 28, 2014, 14 pages.
Advisory Action for U.S. Appl. No. 13/287,713, mailed Feb. 20, 2014, 4 pages.
Non-Final Office Action for U.S. Appl. No. 13/288,517, mailed Apr. 28, 2014, 10 pages.
Non-Final Office Action for U.S. Appl. No. 13/226,843, mailed Mar. 31, 2014, 7 pages.
Notice of Allowance for U.S. Appl. No. 13/288,273, mailed Apr. 25, 2014, 7 pages.
Notice of Allowance for U.S. Appl. No. 13/288,373, mailed May 7, 2014, 7 pages.
Non-Final Office Action for U.S. Appl. No. 13/288,590, mailed May 8, 2014, 11 pages.
Notice of Allowance for U.S. Appl. No. 13/304,762, mailed Apr. 16, 2014, 7 pages.
Final Office Action for U.S. Appl. No. 13/226,777, mailed Mar. 21, 2014, 13 pages.
Non-Final Office Action for U.S. Appl. No. 13/656,997, mailed Apr. 30, 2014, 8 pages.
Non-Final Office Action for U.S. Appl. No. 13/287,726, mailed Jan. 25, 2013, 11 pages.
Non-Final Office Action for U.S. Appl. No. 13/287,726, mailed May 16, 2013, 9 pages.
Notice of Allowance for U.S. Appl. No. 13/287,726, mailed Oct. 7, 2013, 9 pages.
Non-Final Office Action for U.S. Appl. No. 13/287,713, mailed Aug. 5, 2013, 7 pages.
Non-Final Office Action for U.S. Appl. No. 13/287,735, mailed Jan. 25, 2013, 11 pages.
Notice of Allowance for U.S. Appl. No. 13/287,735, mailed May 28, 2013, 8 pages.
Non-Final Office Action for U.S. Appl. No. 13/288,318, mailed Feb. 5, 2013, 12 pages.
Non-Final Office Action for U.S. Appl. No. 13/288,318, mailed Jun. 3, 2013, 14 pages.
Notice of Allowance for U.S. Appl. No. 13/288,318, mailed Oct. 24, 2013, 9 pages.
Non-Final Office Action for U.S. Appl. No. 13/288,478, mailed Dec. 26, 2012, 8 pages.
Non-Final Office Action for U.S. Appl. No. 13/288,478, mailed Jun. 3, 2013, 9 pages.
Non-Final Office Action for U.S. Appl. No. 13/288,517, mailed Dec. 11, 2012, 9 pages.
Non-Final Office Action for U.S. Appl. No. 13/288,517, mailed May 16, 2013, 9 pages.
Non-Final Office Action for U.S. Appl. No. 13/226,843, mailed Mar. 4, 2013, 6 pages.
Final Office Action for U.S. Appl. No. 13/226,843, mailed Jul. 10, 2013, 7 pages.
Advisory Action for U.S. Appl. No. 13/226,843, mailed Sep. 17, 2013, 3 pages.
Non-Final Office Action for U.S. Appl. No. 13/226,843, mailed Oct. 29, 2013, 7 pages.
Non-Final Office Action for U.S. Appl. No. 13/288,273, mailed Feb. 5, 2013, 8 pages.
Non-Final Office Action for U.S. Appl. No. 13/288,273, mailed May 30, 2013, 11 pages.
Notice of Allowance for U.S. Appl. No. 13/288,273 mailed Oct. 24, 2013, 9 pages.
Non-Final Office Action for U.S. Appl. No. 13/288,373, mailed Feb. 25, 2013, 6 pages.
Final Office Action for U.S. Appl. No. 13/288,373, mailed Aug. 2, 2013, 7 pages.
Advisory Action for U.S. Appl. No. 13/288,373, mailed Oct. 15, 2013, 3 pages.
Non-Final Office Action for U.S. Appl. No. 13/289,379, mailed Feb. 25, 2013, 9 pages.
Notice of Allowance for U.S. Appl. No. 13/289,379, mailed Jun. 6, 2013, 9 pages.
Non-Final Office Action for U.S. Appl. No. 13/304,735, mailed Jul. 11, 2013, 8 pages.
Non-Final Office Action for U.S. Appl. No. 13/304,796, mailed Jul. 17, 2013, 8 pages.
Non-Final Office Action for U.S. Appl. No. 13/304,744, mailed Jan. 24, 2013, 10 pages.
Final Office Action for U.S. Appl. No. 13/304,744, mailed May 30, 2013, 12 pages.
Advisory Action for U.S. Appl. No. 13/304,744, mailed Aug. 2, 2013, 3 pages.
Advisory Action for U.S. Appl. No. 13/304,744, mailed Sep. 13, 2013, 3 pages.
Non-Final Office Action for U.S. Appl. No. 13/304,744, mailed Oct. 21, 2013, 12 pages.
Non-Final Office Action for U.S. Appl. No. 13/305,763, mailed Mar. 8, 2013, 10 pages.
Final Office Action for U.S. Appl. No. 13/305,763, mailed Jun. 24, 2013, 13 pages.
Notice of Allowance for U.S. Appl. No. 13/305,763, mailed Sep. 16, 2013, 6 pages.
Notice of Allowance for U.S. Appl. No. 13/304,762, mailed Nov. 27, 2012, 7 pages.
Notice of Allowance for U.S. Appl. No. 13/304,762, mailed Mar. 5, 2013, 7 pages.
Non-Final Office Action for U.S. Appl. No. 13/304,943, mailed Jul. 23, 2013, 8 pages.
Notice of Allowance for U.S. Appl. No. 13/226,777, mailed May 28, 2013, 8 pages.
Non-Final Office Action for U.S. Appl. No. 13/226,777, mailed Oct. 18, 2013, 10 pages.
Notice of Allowance for U.S. Appl. No. 13/226,797, mailed Apr. 26, 2013, 8 pages.
Non-Final Office Action for U.S. Appl. No. 13/226,814, mailed Jun. 13, 2013, 13 pages.
Final Office Action for U.S. Appl. No. 13/226,814, mailed Oct. 23, 2013, 21 pages.
Non-Final Office Action for U.S. Appl. No. 13/479,816, mailed Jul. 5, 2013, 13 pages.
Final Office Action for U.S. Appl. No. 12/723,738, mailed Aug. 11, 2014, 10 pages.
Non-Final Office Action for U.S. Appl. No. 14/010,630, mailed Aug. 6, 2014, 7 pages.
Notice of Allowance for U.S. Appl. No. 13/288,517, mailed Aug. 15, 2014, 7 pages.
Notice of Allowance for U.S. Appl. No. 13/656,997, mailed Sep. 2, 2014, 7 pages.
Notice of Allowance for U.S. Appl. No. 13/761,500, mailed Sep. 19, 2014, 7 pages.
Notice of Allowance for U.S. Appl. No. 12/774,155, mailed Jun. 20, 2014, 8 pages.
Non-Final Office Action for U.S. Appl. No. 14/010,617, mailed Jul. 16, 2014, 6 pages.
Non-Final Office Action for U.S. Appl. No. 13/172,371, mailed Jun. 16, 2014, 7 pages.
Notice of Allowance for U.S. Appl. No. 13/287,726, mailed Aug. 4, 2014, 7 pages.
Non-Final Office Action for U.S. Appl. No. 13/287,672, mailed Jul. 28, 2014, 12 pages.

(56) References Cited

OTHER PUBLICATIONS

Non-Final Office Action for U.S. Appl. No. 13/289,302, mailed Jun. 16, 2014, 7 pages.
Notice of Allowance for U.S. Appl. No. 13/304,762, mailed May 29, 2014, 7 pages.
Non-Final Office Action for U.S. Appl. No. 13/773,888, mailed Jun. 10, 2014, 15 pages.
Author Unknown, "3rd Generation Partnership Project; Technical Specification Group Radio Access Network; Evolved Universal Terrestrial Radio Access (E-UTRA); User Equipment (UE) radio transmission and reception (Release 10)," 3GPP TS 36.101, V10.2.1, Apr. 2011, 225 pages.
Li, C.H., "Quadrature Power Amplifier for RF Applications," Master's Thesis for the University of Twente, Nov. 2009, 102 pages.
Non-Final Office Action for U.S. Appl. No. 13/226,831, mailed Nov. 3, 2014, 12 pages.
Non-Final Office Action for U.S. Appl. No. 13/479,816, mailed Nov. 4, 2014, 11 pages.
Non-Final Office Action for U.S. Appl. No. 13/754,303, mailed Oct. 14, 2014, 14 pages.
Non-Final Office Action for U.S. Appl. No. 13/845,410, mailed Oct. 2, 2014, 5 pages.
Non-Final Office Action for U.S. Appl. No. 12/723,738, mailed Dec. 10, 2014, 11 pages.
Notice of Allowance for U.S. Appl. No. 14/010,617, mailed Dec. 16, 2014, 7 pages.
Notice of Allowance for U.S. Appl. No. 14/010,630, mailed Dec. 31, 2014, 9 pages.
Notice of Allowance for U.S. Appl. No. 13/911,526, mailed Dec. 12, 2014, 9 pages.
Final Office Action for U.S. Appl. No. 13/287,672, mailed Dec. 8, 2014, 14 pages.
Final Office Action for U.S. Appl. No. 13/773,888, mailed Dec. 26, 2014, 18 pages.
Final Office Action for U.S. Appl. No. 12/723,738, mailed Mar. 20, 2015, 11 pages.
Final Office Action for U.S. Appl. No. 13/226,831, mailed Mar. 6, 2015, 6 pages.
Non-Final Office Action for U.S. Appl. No. 13/937,810, mailed Mar. 5, 2015, 5 pages.
Non-Final Office Action for U.S. Appl. No. 13/287,672, mailed Mar. 23, 2015, 7 pages.
Notice of Allowance for U.S. Appl. No. 13/754,303, mailed Feb. 17, 2015, 8 pages.
Notice of Allowance for U.S. Appl. No. 12/723,738, mailed Jun. 5, 2015, 5 pages.
Advisory Action for U.S. Appl. No. 13/226,831 mailed May 13, 2015, 3 pages.
Notice of Allowance for U.S. Appl. No. 13/937,810, mailed Jun. 24, 2015, 5 pages.
Non-Final Office Action for U.S. Appl. No. 13/911,428, mailed Jul. 22, 2015, 10 pages.
Notice of Allowance for U.S. Appl. No. 13/226,831, mailed Aug. 3, 2015, 9 pages.
Final Office Action for U.S. Appl. No. 13/287,672, mailed Jul. 17, 2015, 8 pages.
Non-Final Office Action for U.S. Appl. No. 13/773,888, mailed Aug. 27, 2015, 17 pages.
Advisory Action for U.S. Appl. No. 13/287,672, mailed Sep. 28, 2015, 3 pages.

* cited by examiner

ENVELOPE POWER SUPPLY CALIBRATION OF A MULTI-MODE RADIO FREQUENCY POWER AMPLIFIER

This application is a Divisional of U.S. patent application Ser. No. 13/019,077, filed Feb. 1, 2011, now U.S. Pat. No. 8,548,398, which claims the benefit of U.S. provisional patent application No. 61/300,089, filed Feb. 1, 2010, the disclosures of which are incorporated herein by reference in their entireties.

FIELD OF THE DISCLOSURE

Embodiments of the present disclosure relate to radio frequency (RF) power amplifier (PA) circuitry, which may be used in RF communications systems.

BACKGROUND OF THE DISCLOSURE

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, including protocols that operate using different communications modes, such as a half-duplex mode or a full-duplex mode, and including protocols that operate using different frequency bands. Further, the different communications modes may include different types of RF modulation modes, each of which may have certain performance requirements, such as specific out-of-band emissions requirements or symbol differentiation requirements. In this regard, certain requirements may mandate operation in a linear mode. Other requirements may be less stringent that may allow operation in a non-linear mode to increase efficiency. Wireless communications devices that support such wireless communications protocols may be referred to as multi-mode multi-band communications devices.

A half-duplex mode is a two-way mode of operation, in which a first transceiver communicates with a second transceiver; however, only one transceiver transmits at a time. Therefore, the transmitter and receiver in such a transceiver do not operate simultaneously. For example, certain telemetry systems operate in a send-then-wait-for-reply manner. Many time division duplex (TDD) systems, such as certain Global System for Mobile communications (GSM) systems, operate using the half-duplex mode. A full-duplex mode is a simultaneous two-way mode of operation, in which a first transceiver communicates with a second transceiver and both transceivers may transmit simultaneously; therefore, the transmitter and receiver in such a transceiver must be capable of operating simultaneously. In a full-duplex transceiver, signals from the transmitter must not interfere with signals received by the receiver; therefore, transmitted signals are at transmit frequencies that are different from received signals, which are at receive frequencies. Many frequency division duplex (FDD) systems, such as certain wideband code division multiple access (WCDMA) systems or certain long term evolution (LTE) systems, operate using a full-duplex mode. A linear mode relates to RF signals that include amplitude modulation (AM). A non-linear mode relates to RF signals that do not include AM. Since non-linear mode RF signals do not include AM, devices that amplify such signals may be allowed to operate in saturation. Devices that amplify linear mode RF signals may operate with some level of saturation, but must be able to retain AM characteristics sufficient for proper operation.

As a result of the differences between full duplex operation and half duplex operation, RF front-end circuitry may need specific circuitry for each mode. Additionally, support of multiple frequency bands may require specific circuitry for each frequency band or for certain groupings of frequency bands. FIG. 1 shows a traditional multi-mode multi-band communications device 10 according to the prior art. The traditional multi-mode multi-band communications device 10 includes a traditional multi-mode multi-band transceiver 12, traditional multi-mode multi-band PA circuitry 14, traditional multi-mode multi-band front-end aggregation circuitry 16, and an antenna 18. The traditional multi-mode multi-band PA circuitry 14 includes a first traditional PA 20, a second traditional PA 22, and up to and including an $N^{TH}$ traditional PA 24.

The traditional multi-mode multi-band transceiver 12 may select one of multiple communications modes, which may include a half-duplex transmit mode, a half-duplex receive mode, a full-duplex mode, a linear mode, a non-linear mode, multiple RF modulation modes, or any combination thereof. Further, the traditional multi-mode multi-band transceiver 12 may select one of multiple frequency bands. The traditional multi-mode multi-band transceiver 12 provides an aggregation control signal ACS to the traditional multi-mode multi-band front-end aggregation circuitry 16 based on the selected mode and the selected frequency band. The traditional multi-mode multi-band front-end aggregation circuitry 16 may include various RF components, including RF switches; RF filters, such as bandpass filters, harmonic filters, and duplexers; RF amplifiers, such as low noise amplifiers (LNAs); impedance matching circuitry; the like; or any combination thereof. In this regard, routing of RF receive signals and RF transmit signals through the RF components may be based on the selected mode and the selected frequency band as directed by the aggregation control signal ACS.

The first traditional PA 20 may receive and amplify a first traditional RF transmit signal FTTX from the traditional multi-mode multi-band transceiver 12 to provide a first traditional amplified RF transmit signal FTATX to the antenna 18 via the traditional multi-mode multi-band front-end aggregation circuitry 16. The second traditional PA 22 may receive and amplify a second traditional RF transmit signal STTX from the traditional multi-mode multi-band transceiver 12 to provide a second traditional RF amplified transmit signal STATX to the antenna 18 via the traditional multi-mode multi-band front-end aggregation circuitry 16. The $N^{TH}$ traditional PA 24 may receive an amplify an $N^{TH}$ traditional RF transmit signal NTTX from the traditional multi-mode multi-band transceiver 12 to provide an $N^{TH}$ traditional RF amplified transmit signal NTATX to the antenna 18 via the traditional multi-mode multi-band front-end aggregation circuitry 16.

The traditional multi-mode multi-band transceiver 12 may receive a first RF receive signal FRX, a second RF receive signal SRX, and up to and including an $M^{TH}$ RF receive signal MRX from the antenna 18 via the traditional multi-mode multi-band front-end aggregation circuitry 16. Each of the RF receive signals FRX, SRX, MRX may be associated with at least one selected mode, at least one selected frequency band, or both. Similarly, each of the traditional RF transmit signals FTTX, STTX, NTTX and corresponding traditional amplified RF transmit signals FTATX, STATX, NTATX may be associated with at least one selected mode, at least one selected frequency band, or both.

Portable wireless communications devices are typically battery powered, need to be relatively small, and have low cost. As such, to minimize size, cost, and power consumption, multi-mode multi-band RF circuitry in such a device needs to be as simple, small, and efficient as is practical. Thus, there is a need for multi-mode multi-band RF circuitry in a multi-mode multi-band communications device that is low cost, small, simple, and efficient that meets performance requirements.

SUMMARY OF THE EMBODIMENTS

The present disclosure relates to envelope power supply calibration of a multi-mode RF power amplifier (PA) to ensure adequate headroom when operating using one of multiple communications modes. The communications modes may include multiple modulation modes, a half-duplex mode, a full-duplex mode, or any combination thereof. As such, each communications mode may have specific peak-to-average power and linearity requirements for the multi-mode RF PA. As a result, each communications mode may have corresponding envelope power supply headroom requirements. The calibration may include determining a saturation operating constraint based on calibration data obtained during saturated operation of the multi-mode RF PA at different envelope power supply levels. During operation of the multi-mode RF PA, the envelope power supply may be restricted to provide a minimum allowable magnitude based on an RF signal level of the multi-mode RF PA, the communications mode, and the saturation operating constraint to provide adequate headroom.

By performing the calibration during saturated operation, a maximum power capability of the multi-mode RF PA at each envelope power supply level may be determined. When combined with communications mode specific headroom requirements, the minimum allowable magnitude of the envelope power supply may be determined. As a result, calibrations during linear operation of the multi-mode RF PA may be unnecessary, thereby simplifying calibration requirements. Since efficiency of the multi-mode RF PA may be maximized when the headroom of the envelope power supply is minimized, controlling the envelope power supply to minimize the headroom of the envelope power supply while meeting headroom requirements may optimize the efficiency of the multi-mode RF PA. The multi-mode RF PA may be a multi-mode multi-band RF PA capable of amplifying RF signals in multiple frequency bands. As such, a calibration may be necessary for each frequency band or for certain groupings of frequency bands. However, by performing each calibration during saturated operation, numerous calibrations during linear operations may be avoided, thereby simplifying calibration requirements.

By performing a calibration during saturated operation, temperature compensation of the headroom requirements may be simplified. In one embodiment of the multi-mode RF PA, temperature compensation of a magnitude of the envelope power supply is based on only a single volts-per-degree slope value. The calibration of the multi-mode RF PA may be performed under different conditions, such as during a manufacturing and testing process of the multi-mode RF PA; after the multi-mode RF PA is integrated into a module; after the multi-mode RF PA is integrated into an end product, such as a cell phone; the like; or any combination thereof. The calibration of the multi-mode RF PA may include sweeping the envelope power supply across its operating range. In an alternate embodiment of the multi-mode RF PA, instead of calibrating the multi-mode RF PA directly, a surrogate RF PA may be calibrated instead. As such, the calibration data may be obtained during saturated operation of the surrogate RF PA at different envelope power supply levels. Typically, the multi-mode RF PA would have similar characteristics to those of the surrogate RF PA. For example, the multi-mode RF PA and the surrogate RF PA may be from the same semiconductor wafer. In general, the calibration data is obtained during saturated operation of a calibration RF PA, which may be the multi-mode RF PA or the surrogate RF PA.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

Figure 1:
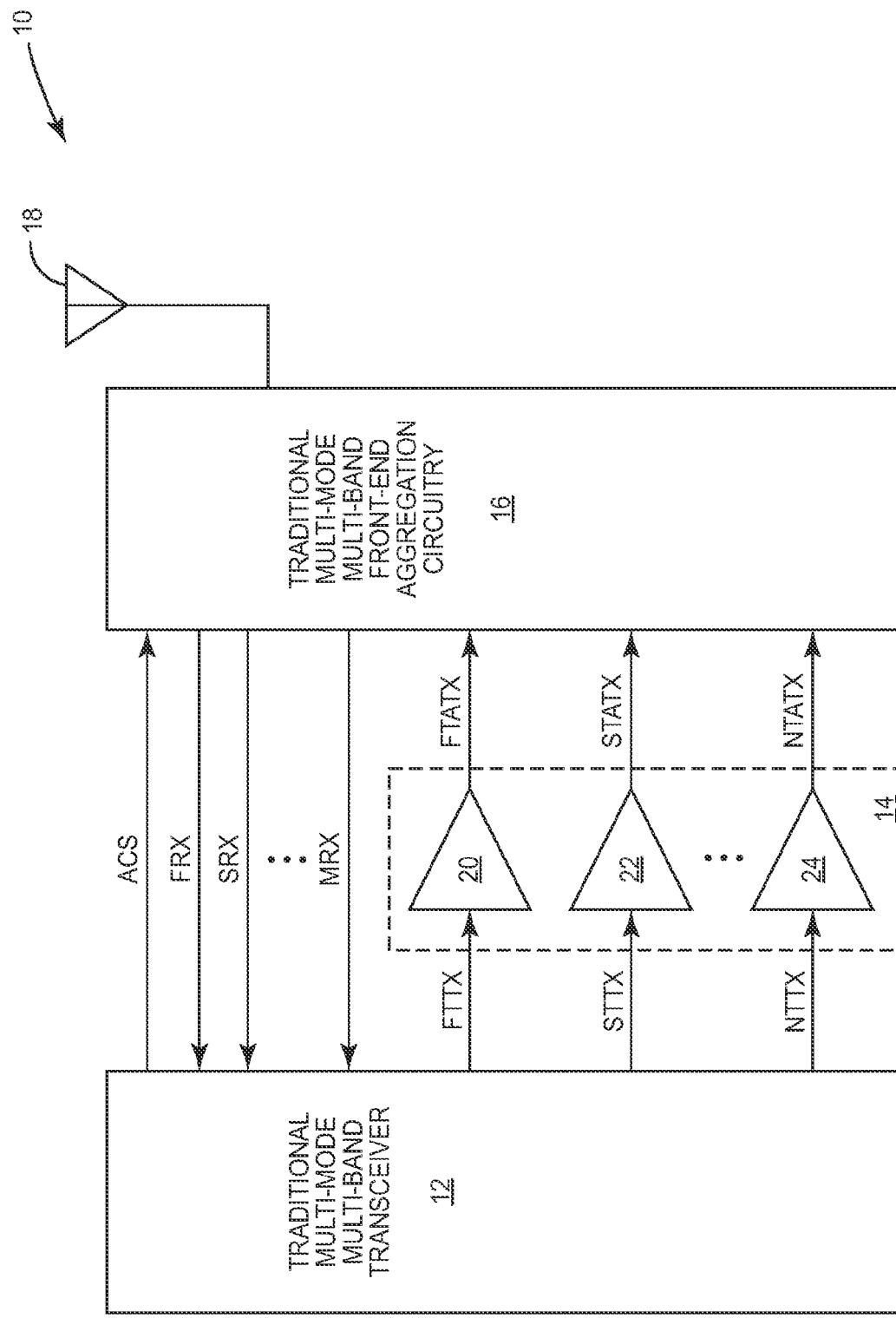
FIG. 1 shows a traditional multi-mode multi-band communications device according to the prior art.

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to envelope power supply calibration of a multi-mode RF power amplifier (PA) to ensure adequate headroom when operating using one of multiple communications modes. The communications modes may include multiple modulation modes, a half-duplex mode, a full-duplex mode, or any combination thereof. As such, each communications mode may have specific peak-to-average power and linearity requirements for the multi-mode RF PA. As a result, each communications mode may have corresponding envelope power supply headroom requirements. The calibration may include determining a saturation operating constraint based on calibration data obtained during saturated operation of the multi-mode RF PA at different envelope power supply levels. During operation of the multi-mode RF PA, the envelope power supply may be restricted to provide a minimum allowable magnitude based on an RF signal level of the multi-mode RF PA, the communications mode, and the saturation operating constraint to provide adequate headroom.

By performing the calibration during saturated operation, a maximum power capability of the multi-mode RF PA at each envelope power supply level may be determined. When combined with communications mode specific headroom requirements, the minimum allowable magnitude of the envelope power supply may be determined. As a result, calibrations during linear operation of the multi-mode RF PA may be unnecessary, thereby simplifying calibration requirements. Since efficiency of the multi-mode RF PA may be maximized when the headroom of the envelope power supply is minimized, controlling the envelope power supply to minimize the headroom of the envelope power supply while meeting headroom requirements may optimize the efficiency of the multi-mode RF PA. The multi-mode RF PA may be a multi-mode multi-band RF PA capable of amplifying RF signals in multiple frequency bands. As such, a calibration may be necessary for each frequency band or for certain groupings of frequency bands. However, by performing each calibration during saturated operation, numerous calibrations during linear operations may be avoided, thereby simplifying calibration requirements.

By performing a calibration during saturated operation, temperature compensation of the headroom requirements may be simplified. In one embodiment of the multi-mode RF PA, temperature compensation of a magnitude of the envelope power supply is based on only a single volts-per-degree slope value. The calibration of the multi-mode RF PA may be performed under different conditions, such as during a manufacturing and testing process of the multi-mode RF PA; after the multi-mode RF PA is integrated into a module; after the multi-mode RF PA is integrated into an end product, such as a cell phone; the like; or any combination thereof. The calibration of the multi-mode RF PA may include sweeping the envelope power supply across its operating range. In an alternate embodiment of the multi-mode RF PA, instead of calibrating the multi-mode RF PA directly, a surrogate RF PA may be calibrated instead. As such, the calibration data may be obtained during saturated operation of the surrogate RF PA at different envelope power supply levels. Typically, the multi-mode RF PA would have similar characteristics to those of the surrogate RF PA. For example, the multi-mode RF PA and the surrogate RF PA may be from the same semiconductor wafer. In general, the calibration data is obtained during saturated operation of a calibration RF PA, which may be the multi-mode RF PA or the surrogate RF PA.

Figure 2:
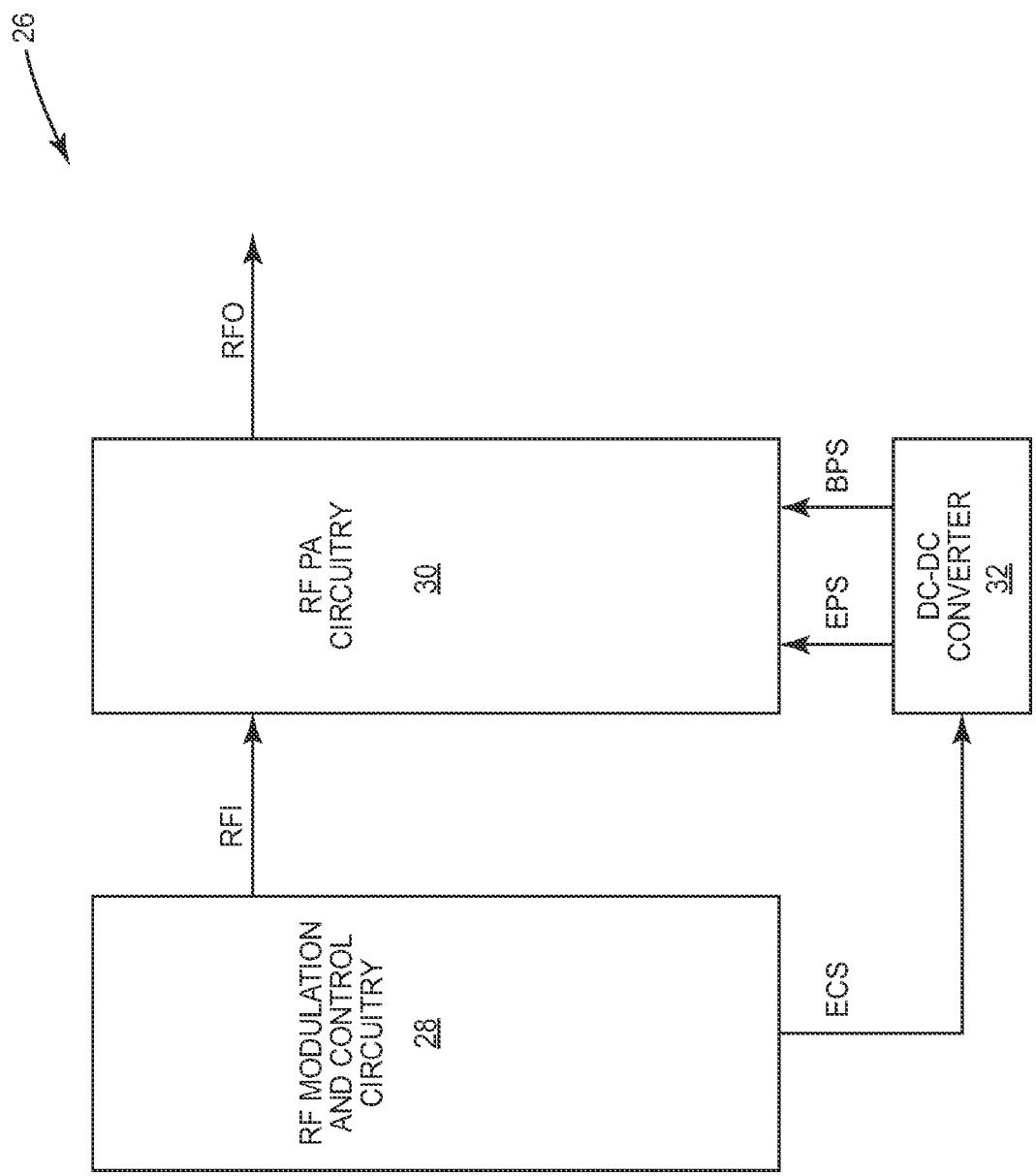
FIG. 2 shows RF communications circuitry according to one embodiment of the RF communications circuitry.

FIG. 2 shows RF communications circuitry 26 according to one embodiment of the RF communications circuitry 26. The RF communications circuitry 26 includes RF modulation and control circuitry 28, RF PA circuitry 30, and a DC-DC converter 32. The RF modulation and control circuitry 28 provides an envelope control signal ECS to the DC-DC converter 32 and provides an RF input signal RFI to the RF PA circuitry 30. The DC-DC converter 32 provides a bias power supply signal BPS and an envelope power supply signal EPS to the RF PA circuitry 30. The envelope power supply signal EPS may be based on the envelope control signal ECS. As such, a magnitude of the envelope power supply signal EPS may be controlled by the RF modulation and control circuitry 28 via the envelope control signal ECS. The RF PA circuitry 30 may receive and amplify the RF input signal RFI to provide an RF output signal RFO. The envelope power supply signal EPS may provide power for amplification of the RF input signal RFI to the RF PA circuitry 30. The RF PA circuitry 30 may use the bias power supply signal BPS to provide biasing of amplifying elements in the RF PA circuitry 30.

In a first embodiment of the RF communications circuitry 26, the RF communications circuitry 26 is multi-mode RF communications circuitry 26. As such, the RF communications circuitry 26 may operate using multiple communications modes. In this regard, the RF modulation and control circuitry 28 may be multi-mode RF modulation and control circuitry 28 and the RF PA circuitry 30 may be multi-mode RF PA circuitry 30. In a second embodiment of the RF communications circuitry 26, the RF communications circuitry 26 is multi-band RF communications circuitry 26. As such, the RF communications circuitry 26 may operate using multiple RF communications bands. In this regard, the RF modulation and control circuitry 28 may be multi-band RF modulation and control circuitry 28 and the RF PA circuitry 30 may be multi-band RF PA circuitry 30. In a third embodiment of the RF communications circuitry 26, the RF communications circuitry 26 is multi-mode multi-band RF communications circuitry 26. As such, the RF communications circuitry 26 may operate using multiple communications modes, multiple RF communications bands, or both. In this regard, the RF modulation and control circuitry 28 may be multi-mode multi-band RF modulation and control circuitry 28 and the RF PA circuitry 30 may be multi-mode multi-band RF PA circuitry 30.

The communications modes may be associated with any number of different communications protocols, such as Global System of Mobile communications (GSM), Gaussian Minimum Shift Keying (GMSK), Enhanced Data rates for GSM Evolution (EDGE), Wideband Code Division Multiple Access (WCDMA), and Long Term Evolution (LTE). The GSM and GMSK protocols do not include amplitude modulation (AM). As such, the GSM and GMSK protocols may be associated with a non-linear mode. Further, the GSM and GMSK protocols may be associated with a saturated mode. The EDGE, WCDMA, and LTE protocols may include AM. As such, the EDGE, WCDMA, and LTE protocols may by associated with a linear mode.

Figure 3:
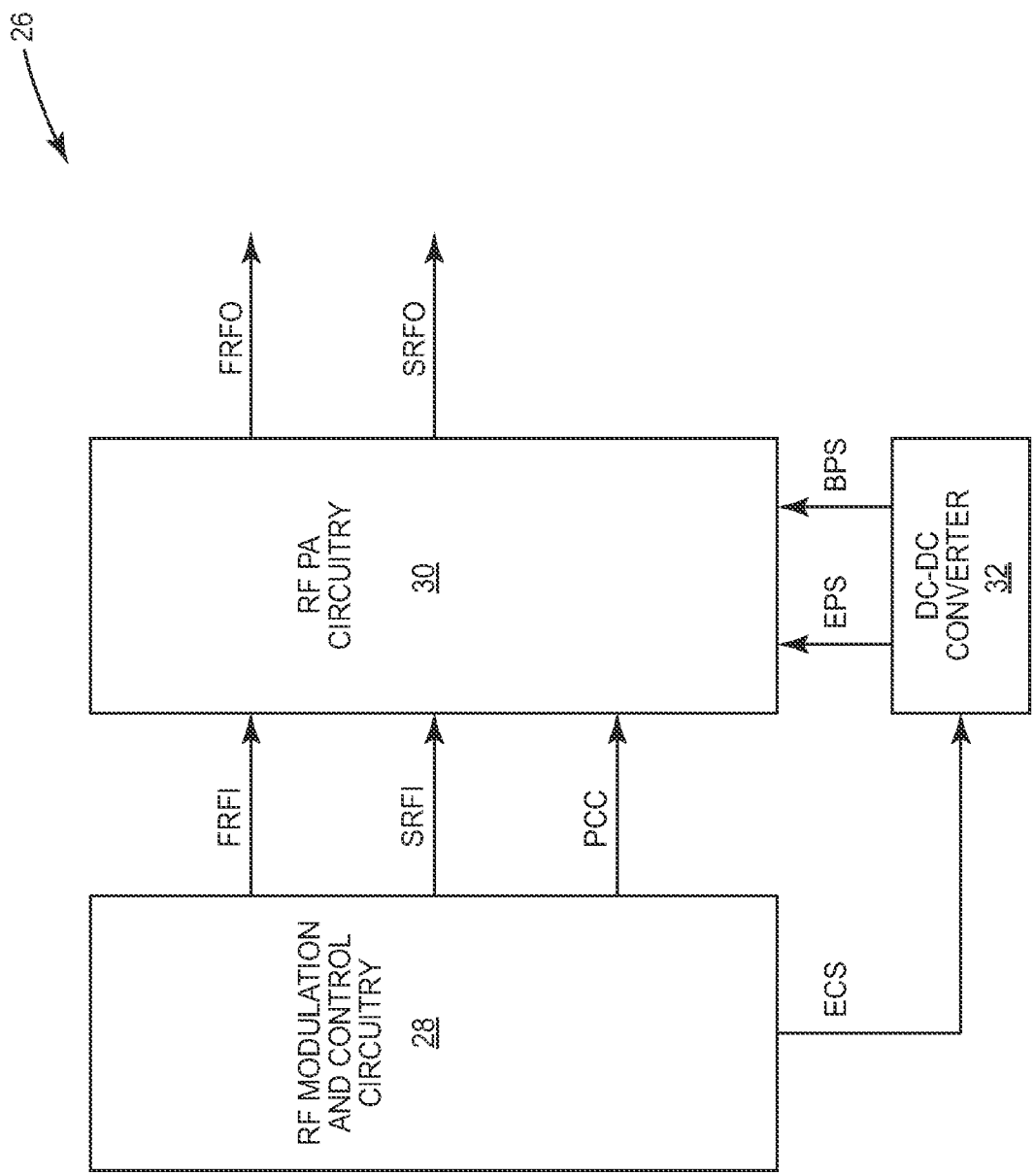
FIG. 3 shows RF communications circuitry according to an alternate embodiment of the RF communications circuitry.

FIG. 3 shows RF communications circuitry 26 according to an alternate embodiment of the RF communications circuitry 26. The RF communications circuitry 26 illustrated in FIG. 3 is similar to the RF communications circuitry 26 illustrated in FIG. 2, except in the RF communications circuitry 26 illustrated in FIG. 3, the RF modulation and control circuitry 28 provides a first RF input signal FRFI, a second RF input signal SRFI, and a PA configuration control signal PCC to the RF PA circuitry 30. The RF PA circuitry 30 may receive and amplify the first RF input signal FRFI to provide a first RF output signal FRFO. The envelope power supply signal EPS may provide power for amplification of the first RF input signal FRFI to the RF PA circuitry 30. The RF PA circuitry 30 may receive and amplify the second RF input signal SRFI to provide a second RF output signal SRFO. The envelope power supply signal EPS may provide power for amplification of the second RF output signal SRFO to the RF PA circuitry 30. Certain configurations of the RF PA circuitry 30 may be based on the PA configuration control signal PCC. As a result, the RF modulation and control circuitry 28 may control such configurations of the RF PA circuitry 30.

Figure 4:
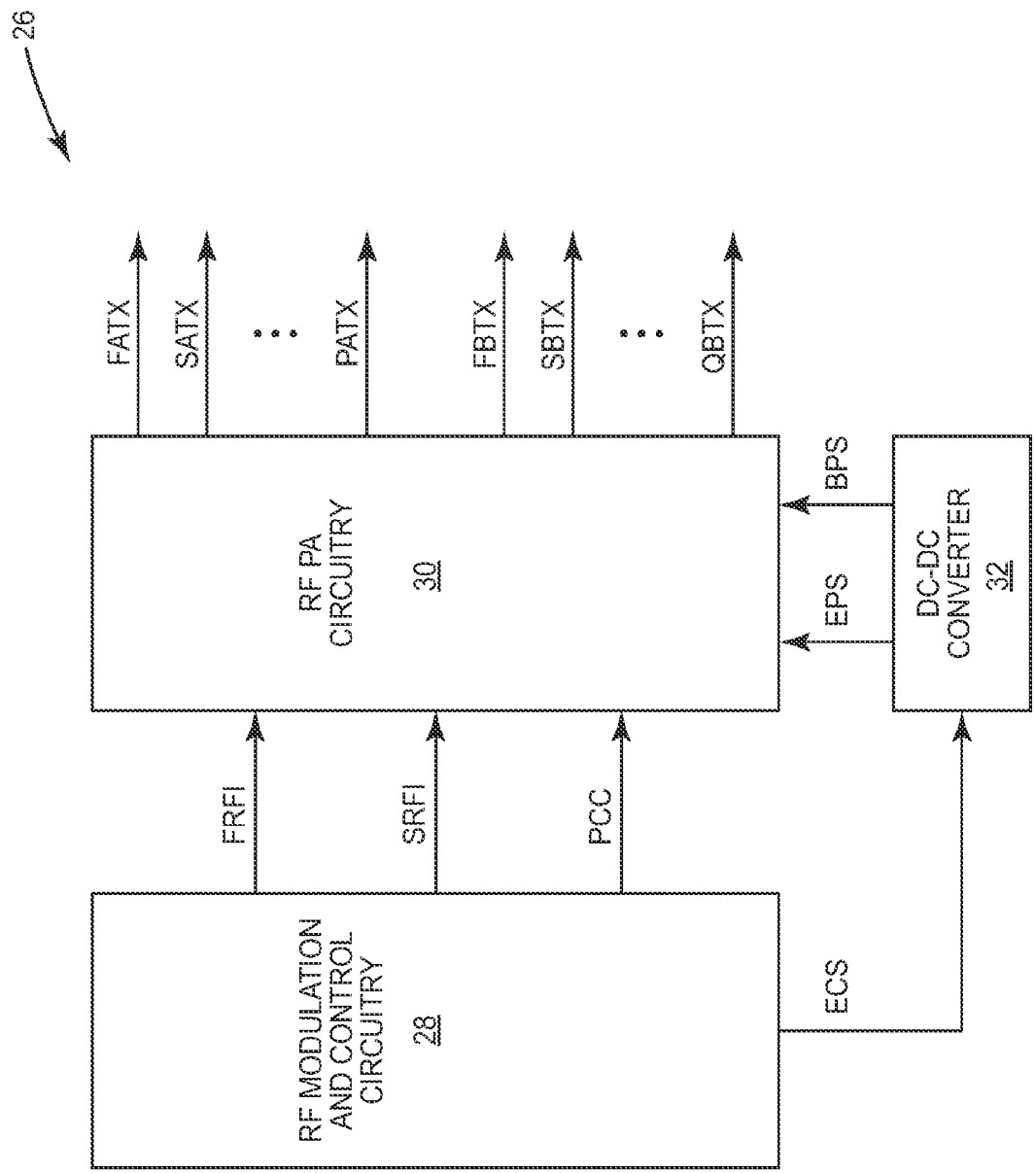
FIG. 4 shows RF communications circuitry according to an additional embodiment of the RF communications circuitry.

FIG. 4 shows RF communications circuitry 26 according to an additional embodiment of the RF communications circuitry 26. The RF communications circuitry 26 illustrated in FIG. 4 is similar to the RF communications circuitry 26 illustrated in FIG. 3, except in the RF communications circuitry 26 illustrated in FIG. 4, the RF PA circuitry 30 does not provide the first RF output signal FRFO and the second RF output signal SRFO. Instead, the RF PA circuitry 30 may provide one of a first alpha RF transmit signal FATX, a second alpha RF transmit signal SATX, and up to and including a $P^{TH}$ alpha RF transmit signal PATX based on receiving and amplifying the first RF input signal FRFI. Similarly, the RF PA circuitry 30 may provide one of a first beta RF transmit signal FBTX, a second beta RF transmit signal SBTX, and up to and including a $Q^{TH}$ beta RF transmit signal QBTX based on receiving and amplifying the second RF input signal SRFI. The one of the transmit signals FATX, SATX, PATX, FBTX, SBTX, QBTX that is selected may be based on the PA configuration control signal PCC.

Figure 5:
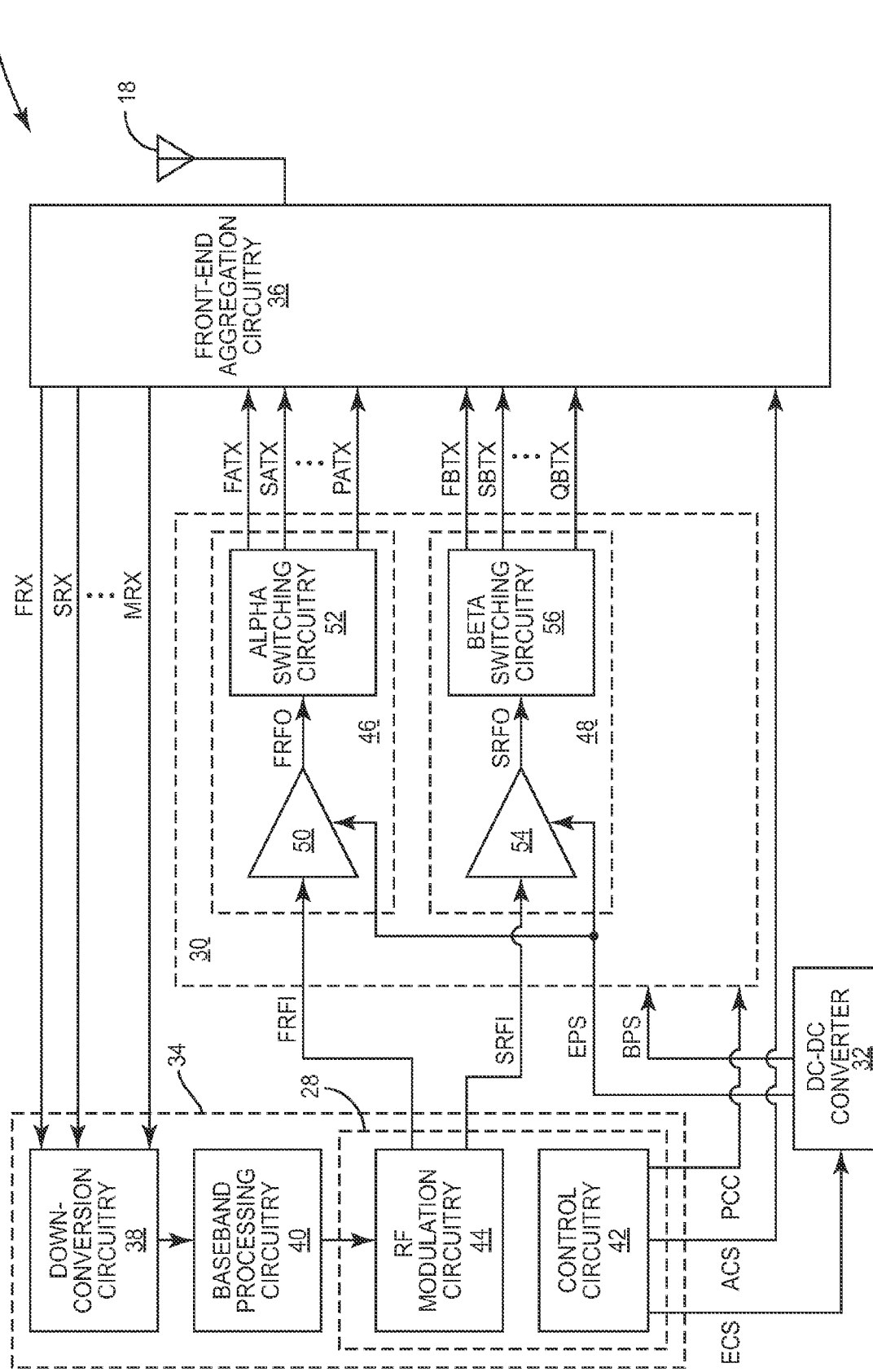
FIG. 5 shows RF communications circuitry according to another embodiment of the RF communications circuitry.

FIG. 5 shows RF communications circuitry 26 according to another embodiment of the RF communications circuitry 26. The RF communications circuitry 26 illustrated in FIG. 5 shows details of the RF modulation and control circuitry 28 and the RF PA circuitry 30 illustrated in FIG. 4. Additionally, the RF communications circuitry 26 illustrated in FIG. 5 further includes transceiver circuitry 34, front-end aggregation circuitry 36, and the antenna 18. The transceiver circuitry 34 includes down-conversion circuitry 38, baseband processing circuitry 40, and the RF modulation and control circuitry 28, which includes control circuitry 42 and RF modulation circuitry 44. The RF PA circuitry 30 includes a first transmit path 46 and a second transmit path 48. The first transmit path 46 includes a first RF PA 50 and alpha switching circuitry 52. The second transmit path 48 includes a second RF PA 54 and beta switching circuitry 56. The front-end aggregation circuitry 36 is coupled to the antenna 18. The control circuitry 42 provides the aggregation control signal ACS to the front-end aggregation circuitry 36. Configuration of the front-end aggregation circuitry 36 may be based on the aggregation control signal ACS. As such, configuration of the front-end aggregation circuitry 36 may be controlled by the control circuitry 42 via the aggregation control signal ACS.

The control circuitry 42 provides the envelope control signal ECS to the DC-DC converter 32 and provides the PA configuration control signal PCC to the RF PA circuitry 30. As such, the control circuitry 42 may control configuration of the RF PA circuitry 30 via the PA configuration control signal PCC and may control a magnitude of the envelope power supply signal EPS via the envelope control signal ECS. The control circuitry 42 may select one of multiple communications modes, which may include a first half-duplex transmit mode, a first half-duplex receive mode, a second half-duplex transmit mode, a second half-duplex receive mode, a first full-duplex mode, a second full-duplex mode, at least one linear mode, at least one non-linear mode, multiple RF modulation modes, or any combination thereof. Further, the control circuitry 42 may select one of multiple frequency bands. The control circuitry 42 may provide the aggregation control signal ACS to the front-end aggregation circuitry 36 based on the selected mode and the selected frequency band. The front-end aggregation circuitry 36 may include various RF components, including RF switches; RF filters, such as bandpass filters, harmonic filters, and duplexers; RF amplifiers, such as low noise amplifiers (LNAs); impedance matching circuitry; the like; or any combination thereof. In this regard, routing of RF receive signals and RF transmit signals through the RF components may be based on the selected mode and the selected frequency band as directed by the aggregation control signal ACS.

The down-conversion circuitry 38 may receive the first RF receive signal FRX, the second RF receive signal SRX, and up to and including the $M^{TH}$ RF receive signal MRX from the antenna 18 via the front-end aggregation circuitry 36. Each of the RF receive signals FRX, SRX, MRX may be associated with at least one selected mode, at least one selected frequency band, or both. The down-conversion circuitry 38 may down-convert any of the RF receive signals FRX, SRX, MRX to baseband receive signals, which may be forwarded to the baseband processing circuitry 40 for processing. The baseband processing circuitry 40 may provide baseband transmit signals to the RF modulation circuitry 44, which may RF modulate the baseband transmit signals to provide the first RF input signal FRFI or the second RF input signal SRFI to the first RF PA 50 or the second RF PA 54, respectively, depending on the selected communications mode.

The first RF PA 50 may receive and amplify the first RF input signal FRFI to provide the first RF output signal FRFO to the alpha switching circuitry 52. Similarly, the second RF PA 54 may receive and amplify the second RF input signal SRFI to provide the second RF output signal SRFO to the beta switching circuitry 56. The first RF PA 50 and the second RF PA 54 may receive the envelope power supply signal EPS, which may provide power for amplification of the first RF input signal FRFI and the second RF input signal SRFI, respectively. The alpha switching circuitry 52 may forward the first RF output signal FRFO to provide one of the alpha transmit signals FATX, SATX, PATX to the antenna 18 via the front-end aggregation circuitry 36, depending on the selected communications mode based on the PA configuration control signal PCC. Similarly, the beta switching circuitry 56 may forward the second RF output signal SRFO to provide one of the beta transmit signals FBTX, SBTX, QBTX to the antenna 18 via the front-end aggregation circuitry 36, depending on the selected communications mode based on the PA configuration control signal PCC.

Figure 6:
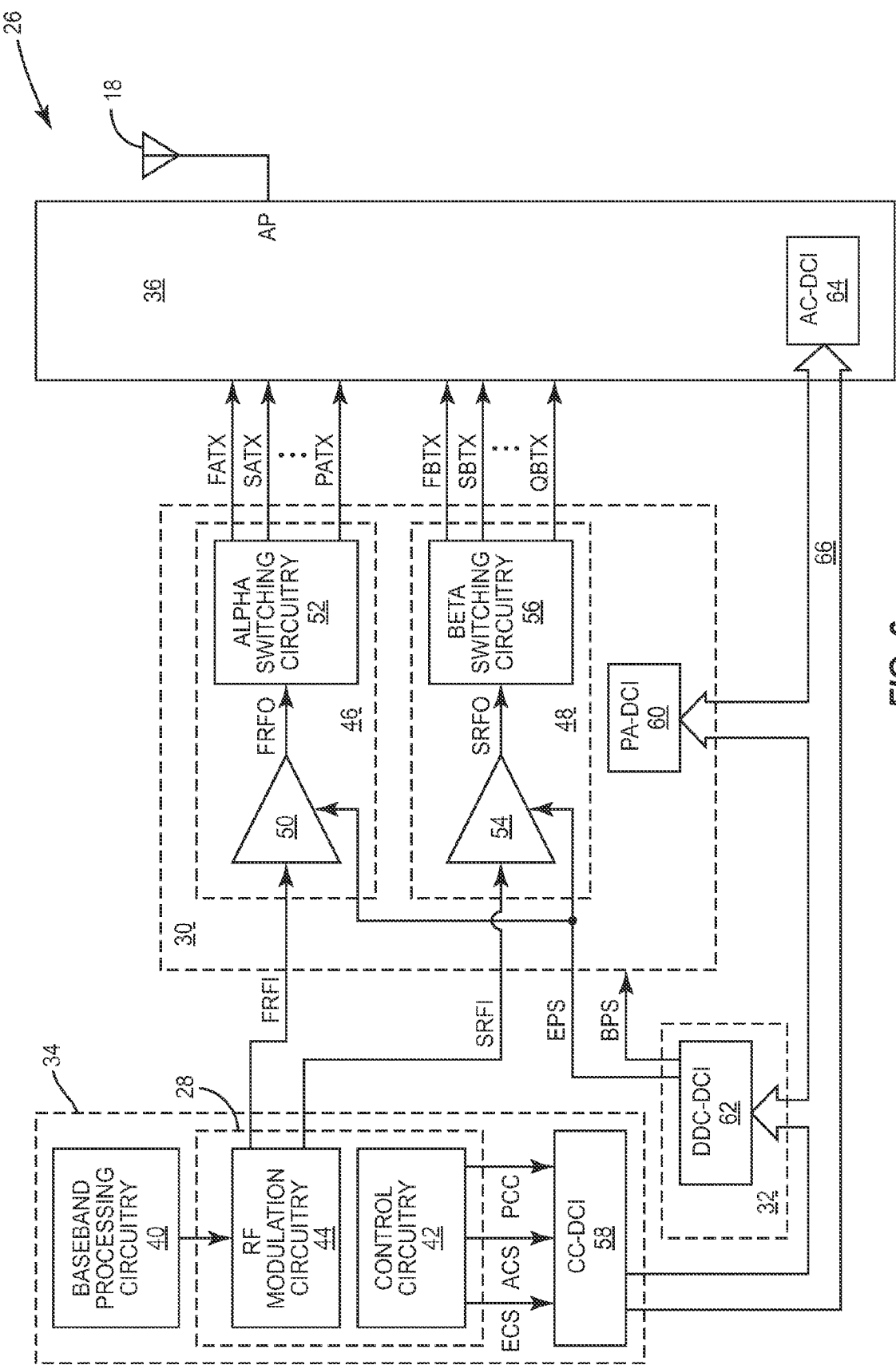
FIG. 6 shows RF communications circuitry according to a further embodiment of the RF communications circuitry.

FIG. 6 shows RF communications circuitry 26 according to a further embodiment of the RF communications circuitry 26. The RF communications circuitry 26 illustrated in FIG. 6 is similar to the RF communications circuitry 26 illustrated in FIG. 5, except in the RF communications circuitry 26 illustrated in FIG. 6, the transceiver circuitry 34 includes a control circuitry digital communications interface (DCI) 58, the RF PA circuitry 30 includes a PA DCI 60, the DC-DC converter 32 includes a DC-DC converter DCI 62, and the front-end aggregation circuitry 36 includes an aggregation circuitry DCI 64. The DCIs 58, 60, 62, 64 are coupled to one another using a digital communications bus 66. In the digital communications bus 66 illustrated in FIG. 6, the digital communications bus 66 is a uni-directional bus in which the control circuitry DCI 58 may communicate information to the PA DCI 60, the DC-DC converter DCI 62, the aggregation circuitry DCI 64, or any combination thereof. As such, the control circuitry 42 may provide the envelope control signal ECS via the control circuitry DCI 58 to the DC-DC converter 32 via the DC-DC converter DCI 62. Similarly, the control circuitry 42 may provide the aggregation control signal ACS via the control circuitry DCI 58 to the front-end aggregation circuitry 36 via the aggregation circuitry DCI 64. Additionally, the control circuitry 42 may provide the PA configuration control signal PCC via the control circuitry DCI 58 to the RF PA circuitry 30 via the PA DCI 60.

Figure 7:
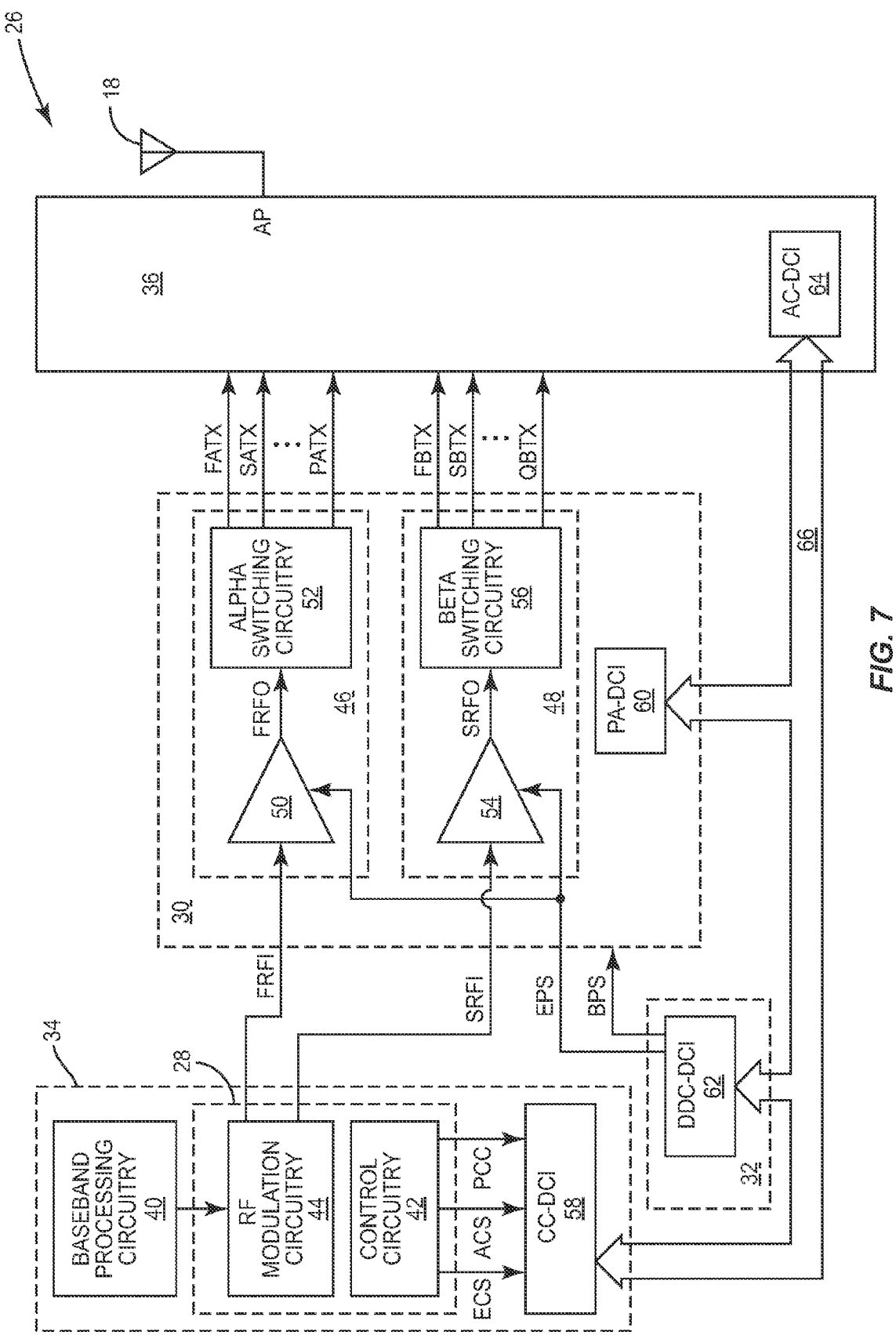
FIG. 7 shows RF communications circuitry according to one embodiment of the RF communications circuitry.

FIG. 7 shows RF communications circuitry 26 according to one embodiment of the RF communications circuitry 26. The RF communications circuitry 26 illustrated in FIG. 7 is similar to the RF communications circuitry 26 illustrated in FIG. 6, except in the RF communications circuitry 26 illustrated in FIG. 7, the digital communications bus 66 is a bi-directional bus and each of the DCIs 58, 60, 62, 64 is capable of receiving or transmitting information. In alternate embodiments of the RF communications circuitry 26, any or all of the DCIs 58, 60, 62, 64 may be uni-directional and any or all of the DCIs 58, 60, 62, 64 may be bi-directional.

Figure 8:
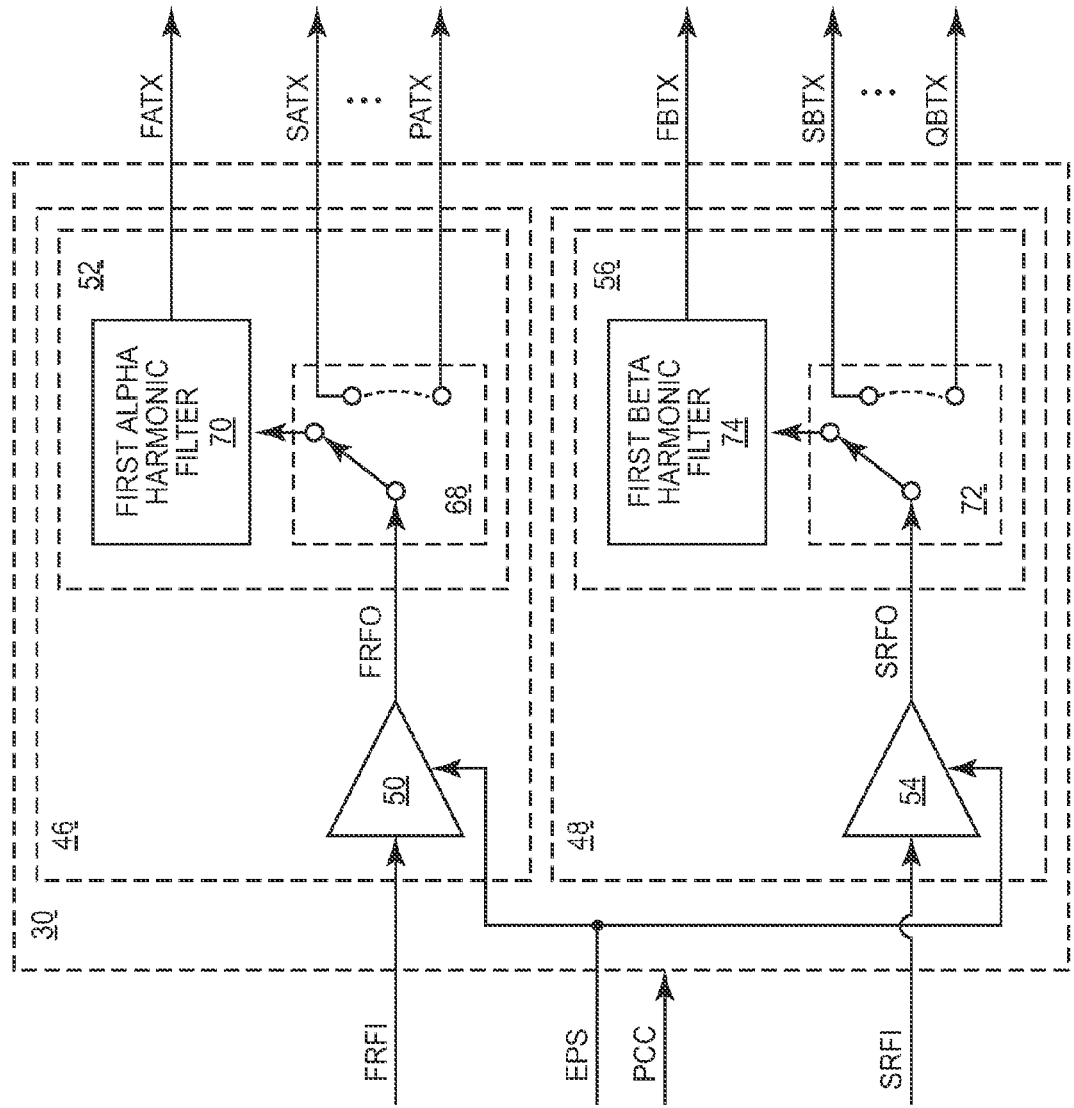
FIG. 8 shows details of RF power amplifier (PA) circuitry illustrated in FIG. 5 according to one embodiment of the RF PA circuitry.

FIG. 8 shows details of the RF PA circuitry 30 illustrated in FIG. 5 according to one embodiment of the RF PA circuitry 30. Specifically, FIG. 8 shows details of the alpha switching circuitry 52 and the beta switching circuitry 56 according to one embodiment of the alpha switching circuitry 52 and the beta switching circuitry 56. The alpha switching circuitry 52 includes an alpha RF switch 68 and a first alpha harmonic filter 70. The beta switching circuitry 56 includes a beta RF switch 72 and a first beta harmonic filter 74. Configuration of the alpha RF switch 68 and the beta RF switch 72 may be based on the PA configuration control signal PCC. In one communications mode, such as an alpha half-duplex transmit mode, an alpha saturated mode, or an alpha non-linear mode, the alpha RF switch 68 is configured to forward the first RF output signal FRFO to provide the first alpha RF transmit signal FATX via the first alpha harmonic filter 70. In another communications mode, such as an alpha full-duplex mode or an alpha linear mode, the alpha RF switch 68 is configured to forward the first RF output signal FRFO to provide any of the second alpha RF transmit signal SATX through the $P^{TH}$ alpha RF transmit signal PATX. When a specific RF band is selected, the alpha RF switch 68 may be configured to provide a corresponding selected one of the second alpha RF transmit signal SATX through the $P^{TH}$ alpha RF transmit signal PATX.

In one communications mode, such as a beta half-duplex transmit mode, a beta saturated mode, or a beta non-linear mode, the beta RF switch 72 is configured to forward the second RF output signal SRFO to provide the first beta RF transmit signal FBTX via the first beta harmonic filter 74. In another communications mode, such as a beta full-duplex mode or a beta linear mode, the beta RF switch 72 is configured to forward the second RF output signal SRFO to provide any of the second beta RF transmit signal SBTX through the $Q^{TH}$ beta RF transmit signal QBTX. When a specific RF band is selected, beta RF switch 72 may be configured to provide a corresponding selected one of the second beta RF transmit signal SBTX through the $Q^{TH}$ beta RF transmit signal QBTX. The first alpha harmonic filter 70 may be used to filter out harmonics of an RF carrier in the first RF output signal FRFO. The first beta harmonic filter 74 may be used to filter out harmonics of an RF carrier in the second RF output signal SRFO.

Figure 9:
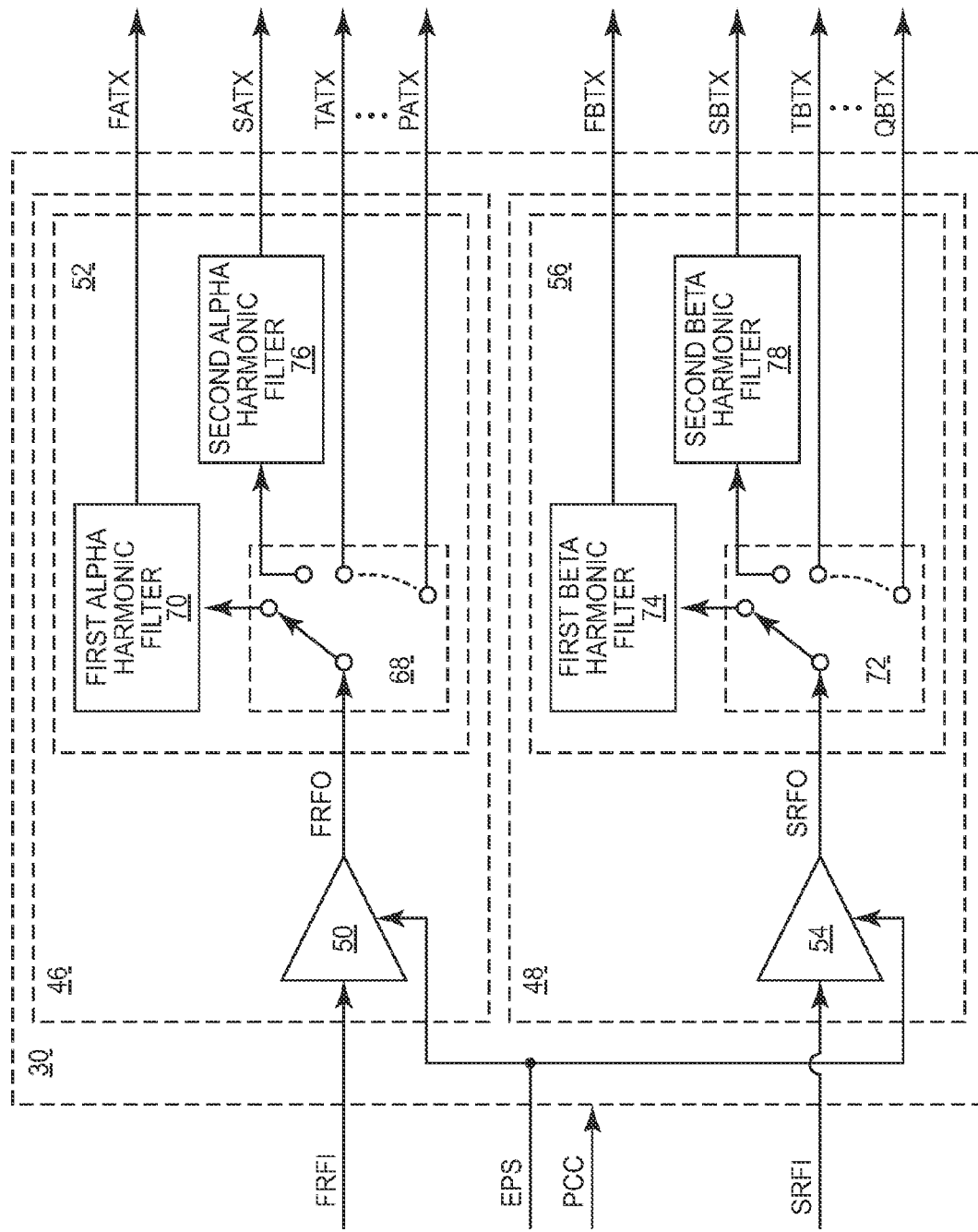
FIG. 9 shows details of the RF PA circuitry illustrated in FIG. 5 according to an alternate embodiment of the RF PA circuitry.

FIG. 9 shows details of the RF PA circuitry 30 illustrated in FIG. 5 according to an alternate embodiment of the RF PA circuitry 30. Specifically, FIG. 9 shows details of the alpha switching circuitry 52 and the beta switching circuitry 56 according to an alternate embodiment of the alpha switching circuitry 52 and the beta switching circuitry 56. The alpha switching circuitry 52 includes the alpha RF switch 68, the first alpha harmonic filter 70, and a second alpha harmonic filter 76. The beta switching circuitry 56 includes the beta RF switch 72, the first beta harmonic filter 74, and a second beta harmonic filter 78. Configuration of the alpha RF switch 68 and the beta RF switch 72 may be based on the PA configuration control signal PCC. In one communications mode, such as a first alpha half-duplex transmit mode, a first alpha saturated mode, or a first alpha non-linear mode, the alpha RF switch 68 is configured to forward the first RF output signal FRFO to provide the first alpha RF transmit signal FATX via the first alpha harmonic filter 70. In another communications mode, such as an second alpha half-duplex transmit mode, a second alpha saturated mode, or a second alpha non-linear mode, the alpha RF switch 68 is configured to forward the first RF output signal FRFO to provide the second alpha RF transmit signal SATX via the second alpha harmonic filter 76. In an alternate communications mode, such as an alpha full-duplex mode or an alpha linear mode, the alpha RF switch 68 is configured to forward the first RF output signal FRFO to provide any of a third alpha RF transmit signal TATX through the $P^{TH}$ alpha RF transmit signal PATX. When a specific RF band is selected, the alpha RF switch 68 may be configured to provide a corresponding selected one of the third alpha RF transmit signal TATX through the $P^{TH}$ alpha RF transmit signal PATX.

In one communications mode, such as a first beta half-duplex transmit mode, a first beta saturated mode, or a first beta non-linear mode, the beta RF switch 72 is configured to forward the second RF output signal SRFO to provide the first beta RF transmit signal FBTX via the first beta harmonic filter 74. In another communications mode, such as a second beta half-duplex transmit mode, a second beta saturated mode, or a second beta non-linear mode, the beta RF switch 72 is configured to forward the second RF output signal SRFO to provide the second beta RF transmit signal SBTX via the second beta harmonic filter 78. In an alternate communications mode, such as a beta full-duplex mode or a beta linear mode, the beta RF switch 72 is configured to forward the second RF output signal SRFO to provide any of a third beta RF transmit signal TBTX through the $Q^{TH}$ beta RF transmit signal QBTX. When a specific RF band is selected, the beta RF switch 72 may be configured to provide a corresponding selected one of the third beta RF transmit signal TBTX through the $Q^{TH}$ beta RF transmit signal QBTX. The first alpha harmonic filter 70 or the second alpha harmonic filter 76 may be used to filter out harmonics of an RF carrier in the first RF output signal FRFO. The first beta harmonic filter 74 or the second beta harmonic filter 78 may be used to filter out harmonics of an RF carrier in the second RF output signal SRFO.

Figure 10:
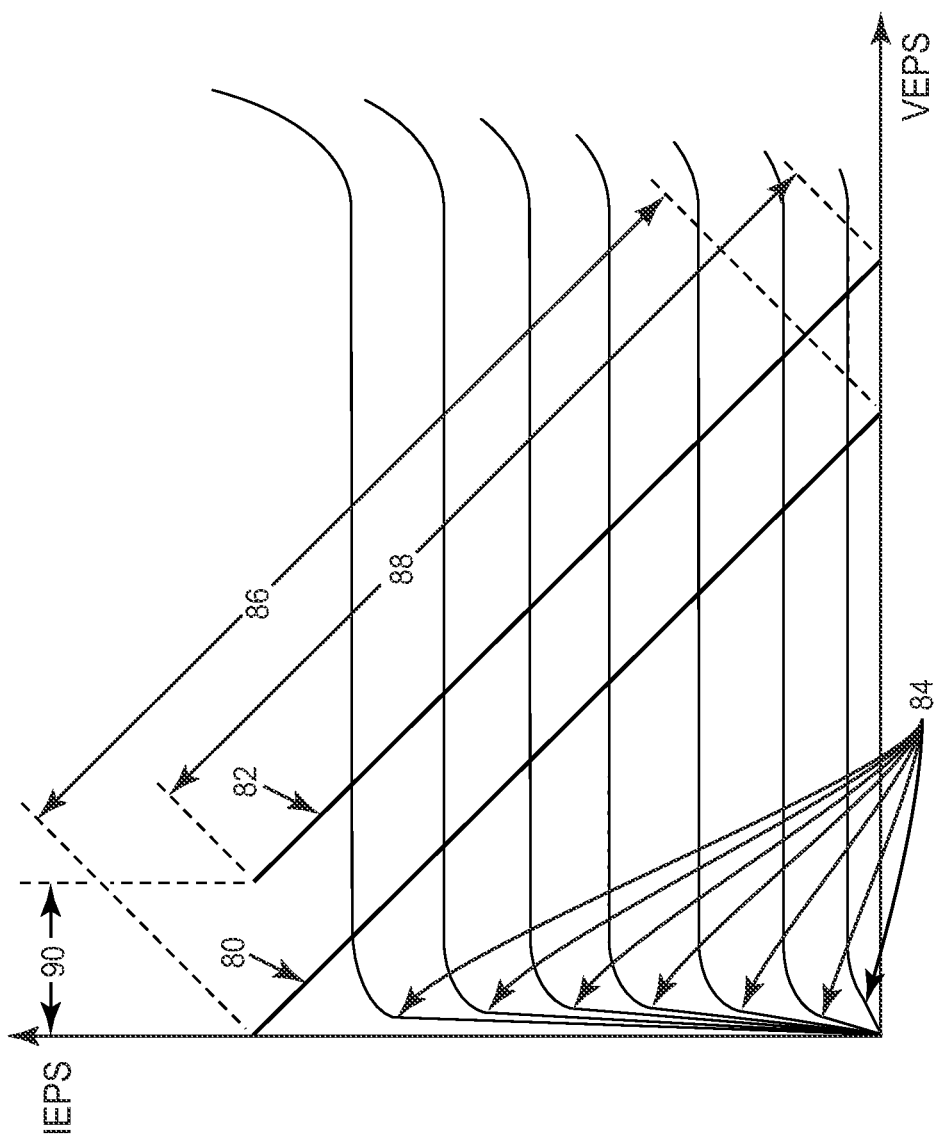
FIG. 10 is a graph showing a saturated load line and a linear load line associated with a first RF PA and an envelope power supply signal illustrated in FIG. 5 according to one embodiment of the first RF PA and the envelope power supply signal.

FIG. 10 is a graph showing a saturated load line 80 and a linear load line 82 associated with the first RF PA 50 and the envelope power supply signal EPS illustrated in FIG. 5 according to one embodiment of the first RF PA 50 and the envelope power supply signal EPS. The horizontal axis of the graph represents an envelope power supply voltage VEPS of the envelope power supply signal EPS and the vertical axis of the graph represents an envelope power supply current IEPS of the envelope power supply signal EPS. Characteristic curves 84 of an amplifying element (not shown) in the first RF PA 50 (FIG. 5) are overlaid onto the graph for clarity. The saturated load line 80 has a saturated operating range 86 and the linear load line 82 has a maximum linear operating range 88. The saturated load line 80 may be associated with operation of the first RF PA 50 in a saturated manner and the linear load line 82 may be associated with operation of the first RF PA 50 in a linear manner. The linear load line 82 is shifted from the saturated load line 80 by an offset 90, which may represent the minimum increase in the envelope power supply voltage VEPS needed to allow the first RF PA 50 to operate in a linear manner. It should be noted that further increases of the envelope power supply voltage VEPS beyond the offset 90 may further increase linearity of the first RF PA 50. Certain modulation modes, particularly those having high peak-to-average powers may need increased linearity for proper operation. The offset 90 may be determined empirically. A similar relationship may exist between the envelope power supply signal EPS and the second RF PA 54 (FIG. 5).

Figure 11:
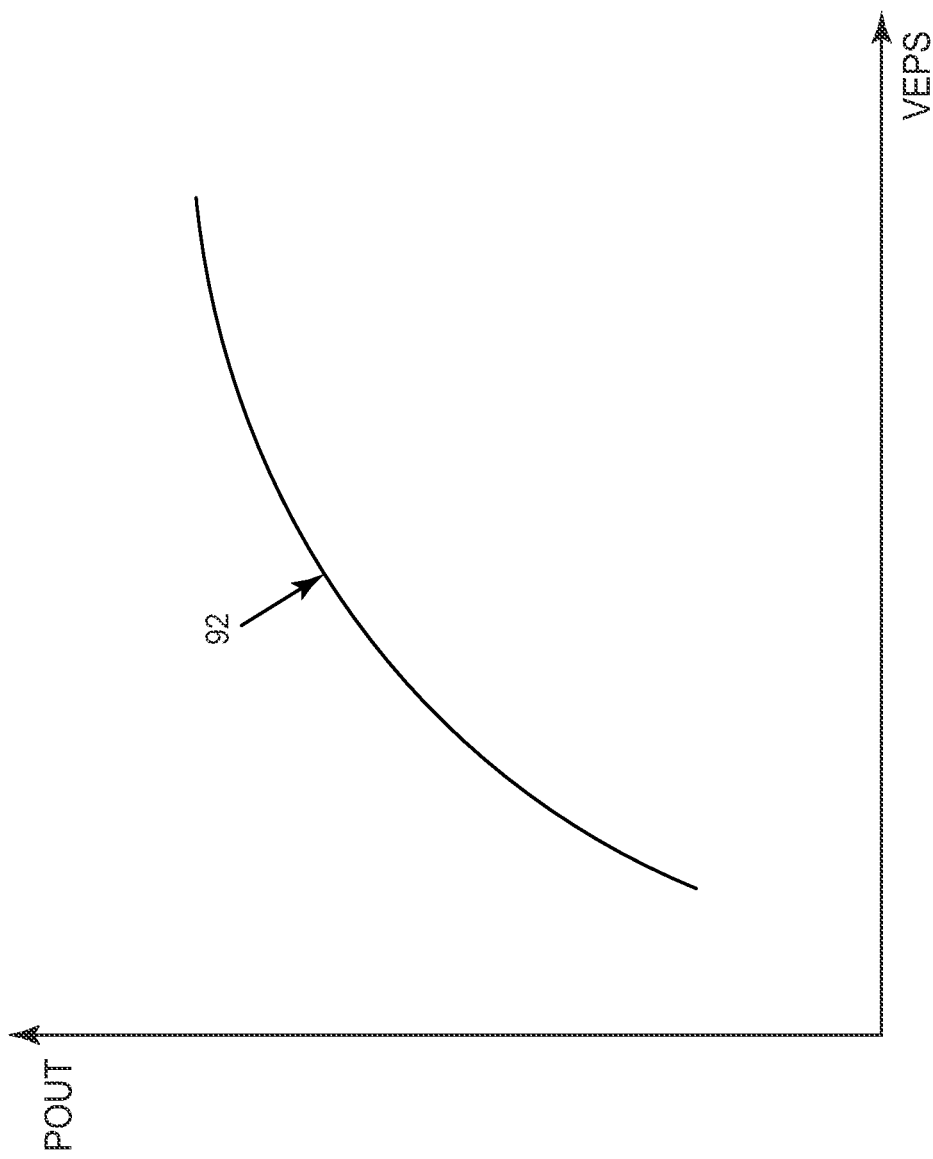
FIG. 11 is a graph showing a saturated operating characteristic associated with the first RF PA and the envelope power supply signal illustrated in FIG. 5 according to one embodiment of the first RF PA and the envelope power supply signal.

FIG. 11 is a graph showing a saturated operating characteristic 92 associated with the first RF PA 50 and the envelope power supply signal EPS illustrated in FIG. 5 according to one embodiment of the first RF PA 50 and the envelope power supply signal EPS. The horizontal axis of the graph represents the envelope power supply voltage VEPS of the envelope power supply signal EPS and the vertical axis of the graph represents an output power POUT from the first RF PA 50 (FIG. 5). The saturated operating characteristic 92 is indicative of saturated operation of the first RF PA 50 over multiple values of the envelope power supply voltage VEPS. Values of the output power POUT that correspond to the multiple values of the envelope power supply voltage VEPS may also correspond to multiple magnitudes of the first RF output signal FRFO, which may correspond to multiple magnitudes of the first RF input signal FRFI.

Figure 12:
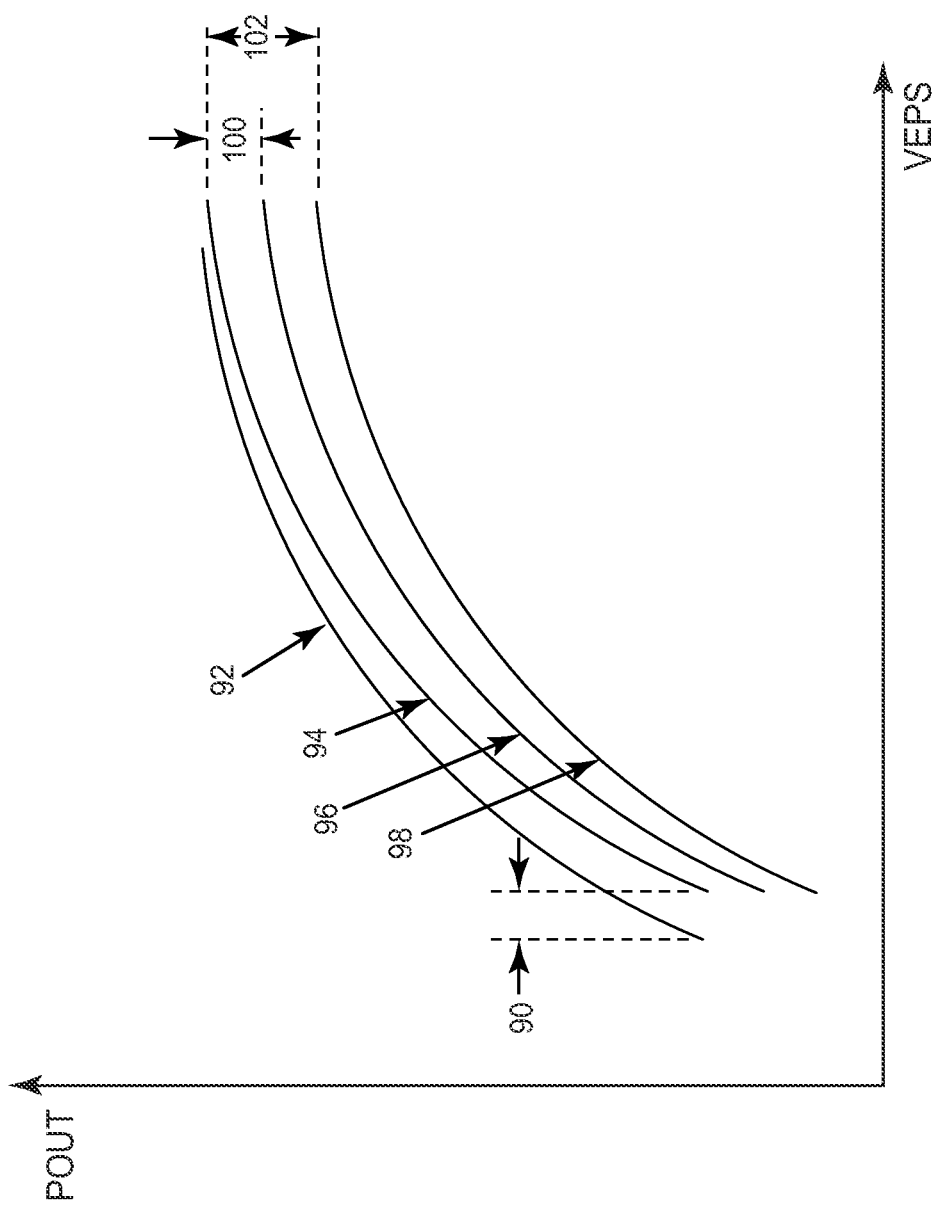
FIG. 12 is a graph showing the saturated operating characteristic, a linear operating characteristic, a first modulation specific operating characteristic, and a second modulation specific operating characteristic associated with the first RF PA and the envelope power supply signal illustrated in FIG. 5 according to one embodiment of the first RF PA and the envelope power supply signal.

FIG. 12 is a graph showing the saturated operating characteristic 92, a linear operating characteristic 94, a first modulation specific operating characteristic 96, and a second modulation specific operating characteristic 98 associated with the first RF PA 50 and the envelope power supply signal EPS illustrated in FIG. 5 according to one embodiment of the first RF PA 50 and the envelope power supply signal EPS. The horizontal axis of the graph represents the envelope power supply voltage VEPS of the envelope power supply signal EPS and the vertical axis of the graph represents the output power POUT from the first RF PA 50 (FIG. 5).

The saturated operating characteristic 92 is indicative of saturated operation of the first RF PA 50 over multiple values of the envelope power supply voltage VEPS. The linear operating characteristic 94 is indicative of linear operation of the first RF PA 50 over multiple values of the envelope power supply voltage VEPS. The linear operating characteristic 94 may be shifted from the saturated operating characteristic 92 by the offset 90, which may represent the minimum approximate increase in the envelope power supply voltage VEPS needed to provide linear operating behavior in the first RF PA 50 (FIG. 5). In general, the offset 90 is based on differences between the saturated operating characteristic 92 and the linear operating characteristic 94.

The first modulation specific operating characteristic 96 may be indicative of operation of the first RF PA 50 (FIG. 5) over multiple values of the envelope power supply voltage VEPS using a first communications mode. The first modulation specific operating characteristic 96 may be shifted from the linear operating characteristic 94 by a first modulation back-off 100, which may represent the minimum approximate decrease in the output power POUT needed to meet linearity requirements mandated by the first communications mode. In general, the first modulation back-off 100 is based on differences between the linear operating characteristic 94 and the first modulation specific operating characteristic 96.

The second modulation specific operating characteristic 98 may be indicative of operation of the first RF PA 50 (FIG. 5) over multiple values of the envelope power supply voltage VEPS using a second communications mode. The second modulation specific operating characteristic 98 may be shifted from the linear operating characteristic 94 by a second modulation back-off 102, which may represent the minimum approximate decrease in the output power POUT needed to meet linearity requirements mandated by the second communications mode. In general, the second modulation back-off 102 is based on differences between the linear operating characteristic 94 and the second modulation specific operating characteristic 98. Generically, a modulation back-off is associated with a selected communications mode and is based on differences between the linear operating characteristic 94 and a modulation specific operating characteristic that is associated with the selected communications mode.

In an exemplary embodiment of the first RF PA 50 (FIG. 5), the first modulation specific operating characteristic 96 is associated with a communications mode that provides voice communications using a WCDMA protocol and the second modulation specific operating characteristic 98 is associated with a communications mode that provides data communications using a WCDMA protocol. The voice signal has a 3.4 decibel (dB) peak-to-average power and the data signal has a 6.8 dB peak-to-average power. As a result, both signals require modulation back-off to meet linearity requirements. However, since the data signal has a larger peak-to-average power than the voice signal, the data signal requires a larger modulation back-off to meet linearity requirements. As such, the first modulation back-off 100 is about 3.2 dB and the second modulation back-off 102 is about 7.2 dB. The values given are exemplary only and are not intended to limit the scope of the invention in any way.

Values of the output power POUT that correspond to the multiple values of the envelope power supply voltage VEPS may also correspond to multiple magnitudes of the first RF output signal FRFO, which may correspond to multiple magnitudes of the first RF input signal FRFI.

Two embodiments of the RF communications circuitry 26 illustrated in FIG. 3 are presented. In a first embodiment of the RF communications circuitry 26, the envelope power supply signal EPS is restricted based on a desired magnitude of the first RF input signal FRFI. In a second embodiment of the RF communications circuitry 26, the first RF input signal FRFI is limited based on a magnitude of the envelope power supply signal EPS.

In the first embodiment of the RF communications circuitry 26 (FIG. 3), the RF PA circuitry 30 (FIG. 3) is associated with a first saturation operating constraint. The RF PA circuitry 30 receives and amplifies the first RF input signal FRFI to provide the first RF output signal FRFO and receives the envelope power supply signal EPS, which provides power for amplification. The RF modulation and control circuitry 28 (FIG. 3) selects one of multiple communications modes and determines a desired magnitude of the first RF input signal FRFI. The RF modulation and control circuitry 28 determines a minimum allowable magnitude of the envelope power supply signal EPS based on the first saturation operating constraint, the selected communications mode, and the desired magnitude of the first RF input signal FRFI. The selected communications mode is associated with any offset 90 (FIG. 12) or modulation back-off needed to provide the linearity required for the selected communications mode. The RF modulation and control circuitry 28 restricts a magnitude of the envelope power supply signal EPS based on the minimum allowable magnitude of the envelope power supply signal EPS by not allowing the magnitude of the envelope power supply signal EPS to drop below the minimum allowable magnitude of the envelope power supply signal EPS. The RF modulation and control circuitry 28 provides the first RF input signal FRFI, which has approximately the desired magnitude of the first RF input signal FRFI and has RF modulation corresponding to the selected communications mode. The first saturation operating constraint may be based on first calibration data, which may be obtained during saturated operation of a calibration RF PA at different envelope power supply levels. The calibration RF PA may be the first RF PA 50 (FIG. 5), the second RF PA 54 (FIG. 5), or a surrogate RF PA (not shown).

The desired magnitude of the first RF input signal FRFI may be based on a desired magnitude of the first RF output signal FRFO, which may be based on a desired RF output power from the RF PA circuitry 30 (FIG. 3). The first saturation operating constraint may be further based on the offset 90 (FIG. 12). Combining the first saturation operating constraint with the offset 90 (FIG. 12), as needed, and any needed modulation back-off, such as the first modulation back-off 100 (FIG. 12) or the second modulation back-off 102 (FIG. 12) may provide adequate headroom for the RF PA circuitry 30 (FIG. 3).

In the second embodiment of the RF communications circuitry 26 (FIG. 3), the RF PA circuitry 30 (FIG. 3) is associated with the first saturation operating constraint. The RF PA circuitry 30 receives and amplifies the first RF input signal FRFI to provide the first RF output signal FRFO and receives the envelope power supply signal EPS, which provides power for amplification. The RF modulation and control circuitry 28 (FIG. 3) selects one of multiple communications modes. The RF modulation and control circuitry 28 determines a maximum allowable magnitude of the first RF input signal FRFI based on the first saturation operating constraint, the selected communications mode, and a magnitude of the envelope power supply signal EPS. The selected communications mode is associated with any offset 90 (FIG. 12) or modulation back-off needed to provide the linearity required for the selected communications mode. The RF modulation and control circuitry 28 limits a magnitude of the first RF input signal FRFI based on the maximum allowable magnitude of the first RF input signal FRFI by not allowing the magnitude of the first RF input signal FRFI to exceed the maximum allowable magnitude of the first RF input signal FRFI. The RF modulation and control circuitry 28 provides the first RF input signal FRFI, which has RF modulation corresponding to the selected communications mode. The first saturation operating constraint may be based on first calibration data, which may be obtained during saturated operation of a calibration RF PA at different envelope power supply levels. The calibration RF PA may be the first RF PA 50 (FIG. 5), the second RF PA 54 (FIG. 5), or a surrogate RF PA (not shown). The maximum allowable magnitude of the first RF input signal FRFI may be based on a maximum allowable magnitude of the first RF output signal FRFO, which may be based on a maximum RF output power from the RF PA circuitry 30 (FIG. 3). The maximum RF output power may be based on the first saturation operating constraint.

In one embodiment of the RF communications circuitry 26 (FIG. 5), the first RF PA 50 (FIG. 5) is associated with a first saturation operating constraint and the second RF PA 54 (FIG. 5) is associated with a second saturation operating constraint. When selected, the first RF PA 50 may receive and amplify the first RF input signal FRFI to provide the first RF output signal FRFO and may receive the envelope power supply signal EPS, which may provide power for amplification to the first RF PA 50. When selected, the second RF PA 54 may receive and amplify the second RF input signal SRFI to provide the second RF output signal SRFO and may receive the envelope power supply signal EPS, which may provide power for amplification to the second RF PA 54.

The RF modulation and control circuitry 28 (FIG. 5) may select either the first RF PA 50 (FIG. 5) or the second RF PA 54 (FIG. 5) and may select one of multiple communications modes. When the first RF PA 50 is selected, the RF modulation and control circuitry 28 determines a desired magnitude of the first RF input signal FRFI. When the second RF PA 54 is selected, the RF modulation and control circuitry 28 determines a desired magnitude of the second RF input signal SRFI. When the first RF PA 50 is selected, the RF modulation and control circuitry 28 determines a minimum allowable magnitude of the envelope power supply signal EPS based on the first saturation operating constraint, the selected communications mode, and the desired magnitude of the first RF input signal FRFI. The selected communications mode is associated with any offset 90 or modulation back-off needed to provide the linearity required for the selected communications mode. When the second RF PA 54 is selected, the RF modulation and control circuitry 28 determines a minimum allowable magnitude of the envelope power supply signal EPS based on the second saturation operating constraint, the selected communications mode, and the desired magnitude of the second RF input signal SRFI.

The RF modulation and control circuitry 28 (FIG. 5) restricts a magnitude of the envelope power supply signal EPS based on the minimum allowable magnitude of the envelope power supply signal EPS by not allowing the magnitude of the envelope power supply signal EPS to drop below the minimum allowable magnitude of the envelope power supply signal EPS. When the first RF PA 50 (FIG. 5) is selected, the RF modulation and control circuitry 28 may provide the first RF input signal FRFI, which has approximately the desired magnitude of the first RF input signal FRFI and has RF modulation corresponding to the selected communications mode. When the second RF PA 54 (FIG. 5) is selected, the RF modulation and control circuitry 28 provides the second RF input signal SRFI, which has approximately the desired magnitude of the second RF input signal SRFI and has RF modulation corresponding to the selected communications mode. The first saturation operating constraint may be about equal to the second saturation operating constraint. The first saturation operating constraint may be based on first calibration data, which may be obtained during saturated operation of a calibration RF PA at different envelope power supply levels. The calibration RF PA may be the first RF PA 50 (FIG. 5), the second RF PA 54 (FIG. 5), or a surrogate RF PA (not shown). The second saturation operating constraint may be based on second calibration data, which may be obtained during saturated operation of the second RF PA 54 at different envelope power supply levels. The first RF PA 50 may be a highband RF PA and the second RF PA 54 may be a lowband RF PA.

Figure 13:
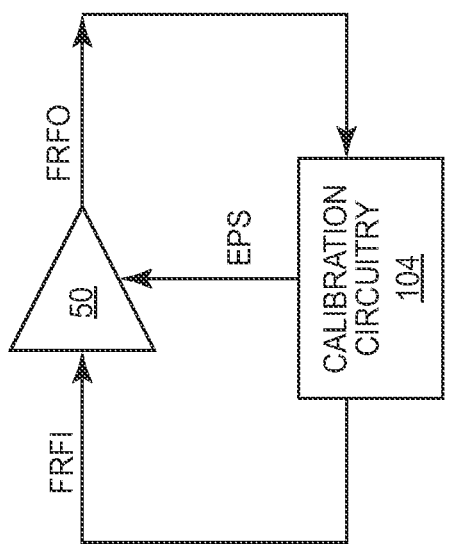
FIG. 13 shows a calibration configuration for obtaining first calibration data at different envelope power supply levels according to one embodiment of the present disclosure.

FIG. 13 shows a calibration configuration for obtaining the first calibration data, which may be acquired during saturated operation of the first RF PA 50 at different envelope power supply levels according to one embodiment of the present disclosure. The first calibration data is associated with a saturated operating characteristic of the first RF PA 50. Calibration circuitry 104 provides the first RF input signal FRFI and the envelope power supply signal EPS to the first RF PA 50. The first RF PA 50 receives and amplifies the first RF input signal FRFI to provide the first RF output signal FRFO to the calibration circuitry 104. The envelope power supply signal EPS provides power for amplification to the first RF PA 50. The calibration circuitry 104 provides the first RF input signal FRFI and the envelope power supply signal EPS as necessary for saturated operation of the first RF PA 50 at different envelope power supply levels. The calibration circuitry 104 obtains the first calibration data via the first RF output signal FRFO.

Figure 14:
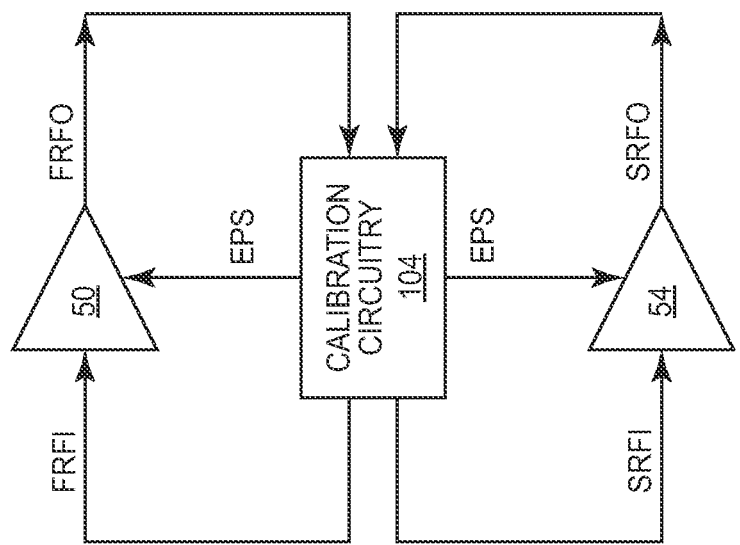
FIG. 14 shows a calibration configuration for obtaining the first calibration data and second calibration data according to an alternate embodiment of the present disclosure.

FIG. 14 shows a calibration configuration for obtaining the first calibration data and the second calibration data according to an alternate embodiment of the present disclosure. The first calibration data may be acquired during saturated operation of the first RF PA 50 at different envelope power supply levels and the second calibration data may be acquired during saturated operation of the second RF PA 54 at different envelope power supply levels. The first calibration data is associated with a saturated operating characteristic of the first RF PA 50 and the second calibration data is associated with a saturated operating characteristic of the second RF PA 54.

The calibration circuitry 104 provides the first RF input signal FRFI and the envelope power supply signal EPS to the first RF PA 50 and provides the second RF input signal SRFI and the envelope power supply signal EPS to the second RF PA 54. The first RF PA 50 receives and amplifies the first RF input signal FRFI to provide the first RF output signal FRFO to the calibration circuitry 104. The envelope power supply signal EPS provides power for amplification to the first RF PA 50. The second RF PA 54 receives and amplifies the second RF input signal SRFI to provide the second RF output signal SRFO to the calibration circuitry 104. The envelope power supply signal EPS provides power for amplification to the second RF PA 54. The calibration circuitry 104 provides the first RF input signal FRFI and the envelope power supply signal EPS as necessary for saturated operation of the first RF PA 50 at different envelope power supply levels. The calibration circuitry 104 obtains the first calibration data via the first RF output signal FRFO. Similarly, the calibration circuitry 104 provides the second RF input signal SRFI and the envelope power supply signal EPS as necessary for saturated operation of the second RF PA 54 at different envelope power supply levels. The calibration circuitry 104 obtains the second calibration data via the second RF output signal SRFO.

Figure 15:
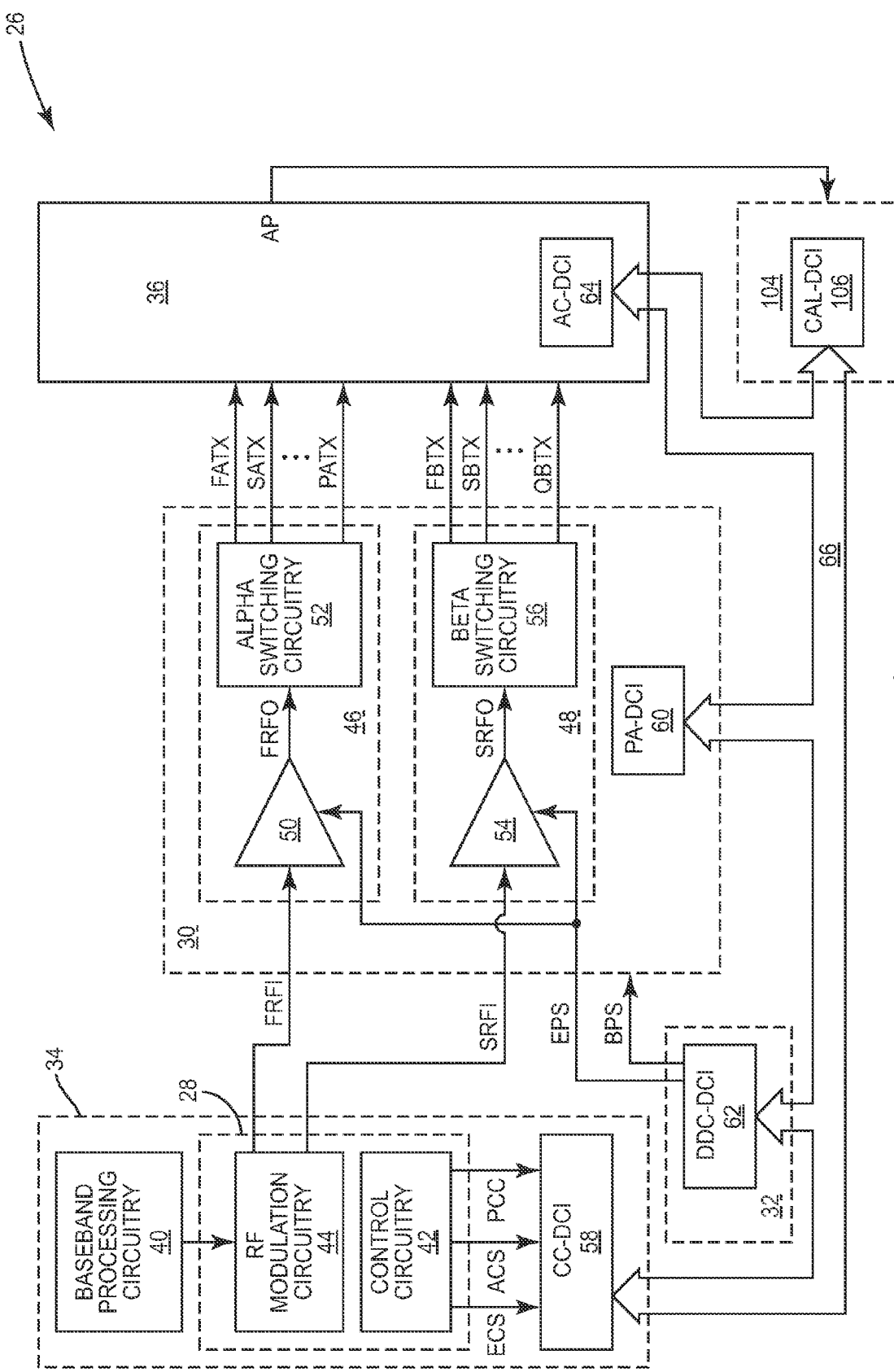
FIG. 15 shows a calibration configuration for obtaining the first calibration data and the second calibration data according to an additional embodiment of the present disclosure.

FIG. 15 shows a calibration configuration for obtaining the first calibration data and the second calibration data according to an additional embodiment of the present disclosure. The calibration configuration illustrated in FIG. 15 includes the RF communications circuitry 26 illustrated in FIG. 7 and the calibration circuitry 104. The calibration circuitry 104 includes calibration circuitry DCI 106 which is coupled to the transceiver circuitry 34, the RF PA circuitry 30, the DC-DC converter 32, and the front-end aggregation circuitry 36 via the digital communications bus 66. Further, the calibration circuitry 104 is coupled to the antenna port AP of the front-end aggregation circuitry 36. The first calibration data may be acquired during saturated operation of the first RF PA 50 at different envelope power supply levels and the second calibration data may be acquired during saturated operation of the second RF PA 54 at different envelope power supply levels. The first calibration data is associated with the saturated operating characteristic of the first RF PA 50 and the second calibration data. The second calibration data is associated with the saturated operating characteristic of the second RF PA 54.

The calibration circuitry 104 provides saturated operation of the first RF PA 50 and the second RF PA 54 by controlling the first RF input signal FRFI and the second RF input signal SRFI using the transceiver circuitry 34 via the control circuitry DCI 58. Further, the calibration circuitry 104 provides saturated operation of the first RF PA 50 and the second RF PA 54 by controlling the envelope power supply signal EPS using the DC-DC converter 32 via the DC-DC converter DCI 62. The calibration circuitry 104 controls the RF PA circuitry 30 via the PA DCI 60 and controls the front-end aggregation circuitry 36 via the aggregation circuitry DCI 64 to route either the first RF output signal FRFO or the second RF output signal SRFO, as necessary, to the calibration circuitry 104 through the antenna port AP.

The calibration circuitry 104 controls the first RF input signal FRFI and the envelope power supply signal EPS as necessary for saturated operation of the first RF PA 50 at different envelope power supply levels. The calibration circuitry 104 obtains the first calibration data via the first RF output signal FRFO. Similarly, the calibration circuitry 104 controls the second RF input signal SRFI and the envelope power supply signal EPS as necessary for saturated operation of the second RF PA 54 at different envelope power supply levels. The calibration circuitry 104 obtains the second calibration data via the second RF output signal SRFO.

Figure 16:
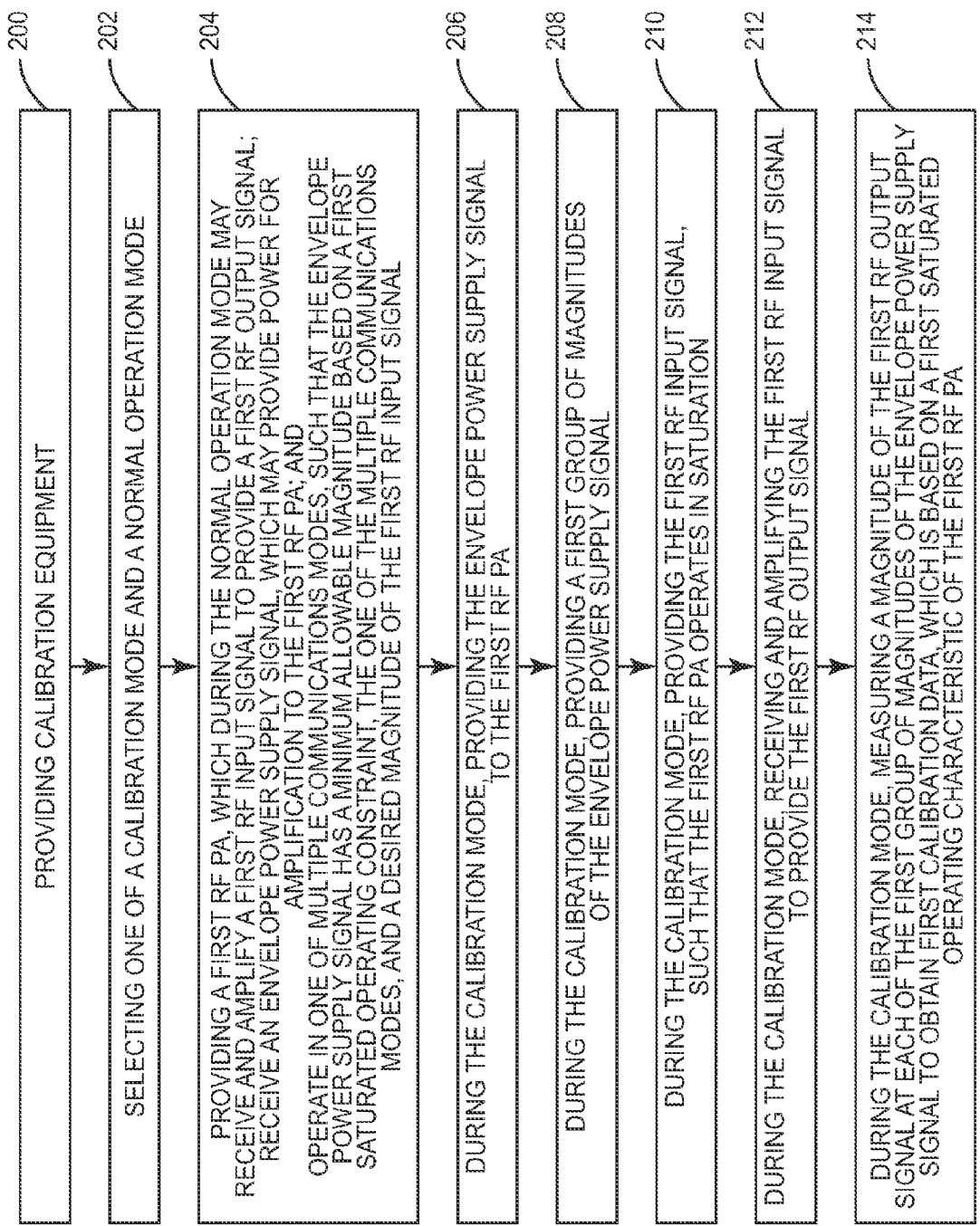
FIG. 16 illustrates a process for obtaining the first calibration data according to one embodiment of the present disclosure.

FIG. 16 illustrates a process for obtaining the first calibration data according to one embodiment of the present disclosure. The process may be associated any of the calibration configurations illustrated in FIG. 13, FIG. 14, or FIG. 15. The process begins by providing calibration equipment (Step 200), such as the calibration circuitry 104. The process continues by selecting one of a calibration mode and a normal operation mode (Step 202). This step may be performed by the calibration equipment or by other circuitry. The process continues by providing the first RF PA 50, which during the normal operation mode may receive and amplify the first RF input signal FRFI to provide the first RF output signal FRFO; receive the envelope power supply signal EPS, which may provide power for amplification to the first RF PA 50; and operate in one of multiple communications modes, such that the envelope power supply signal EPS has a minimum allowable magnitude based on a first saturated operating constraint, the one of the multiple communications modes, and a desired magnitude of the first RF input signal FRFI (Step 204).

The process continues by during the calibration mode, providing the envelope power supply signal EPS to the first RF PA 50 (Step 206), followed by during the calibration mode, providing a first group of magnitudes of the envelope power supply signal EPS (Step 208), which is followed by during the calibration mode, providing the first RF input signal FRFI, such that the first RF PA 50 operates in saturation (Step 210). In general, the input power to the first RF PA 50 may be controlled by controlling the first RF input signal FRFI, such that the first RF PA 50 remains sufficiently saturated while the envelope power supply signal EPS is varied.

The envelope power supply signal EPS may be varied though its operating range. Further, the envelope power supply signal EPS may be swept through its operating range. The first RF input signal FRFI may be a constant power continuous wave (CW) signal, a modulated GMSK signal, or some other signal that keeps the first RF PA 50 in sufficient saturation.

The process continues by during the calibration mode, receiving and amplifying the first RF input signal FRFI to provide the first RF output signal FRFO (Step 212). This step may typically be performed by the first RF PA 50. The process completes by during the calibration mode, measuring a magnitude of the first RF output signal FRFO at each of the first group of magnitudes of the envelope power supply signal EPS to obtain the first calibration data, which is based on a first saturated operating characteristic of the first RF PA 50 (Step 214). In an alternate embodiment of the process for obtaining the first calibration data, the process includes the additional step of during the calibration mode, providing the RF PA circuitry 30, the DC-DC converter 32, the transceiver circuitry 34, and the front-end aggregation circuitry 36 having the antenna port AP, such that the measuring the magnitude of the first RF output signal FRFO is via the antenna port AP. In an additional embodiment of the process for obtaining the first calibration data, any of the process steps may be omitted, additional process steps may be added, or both.

Figure 17:
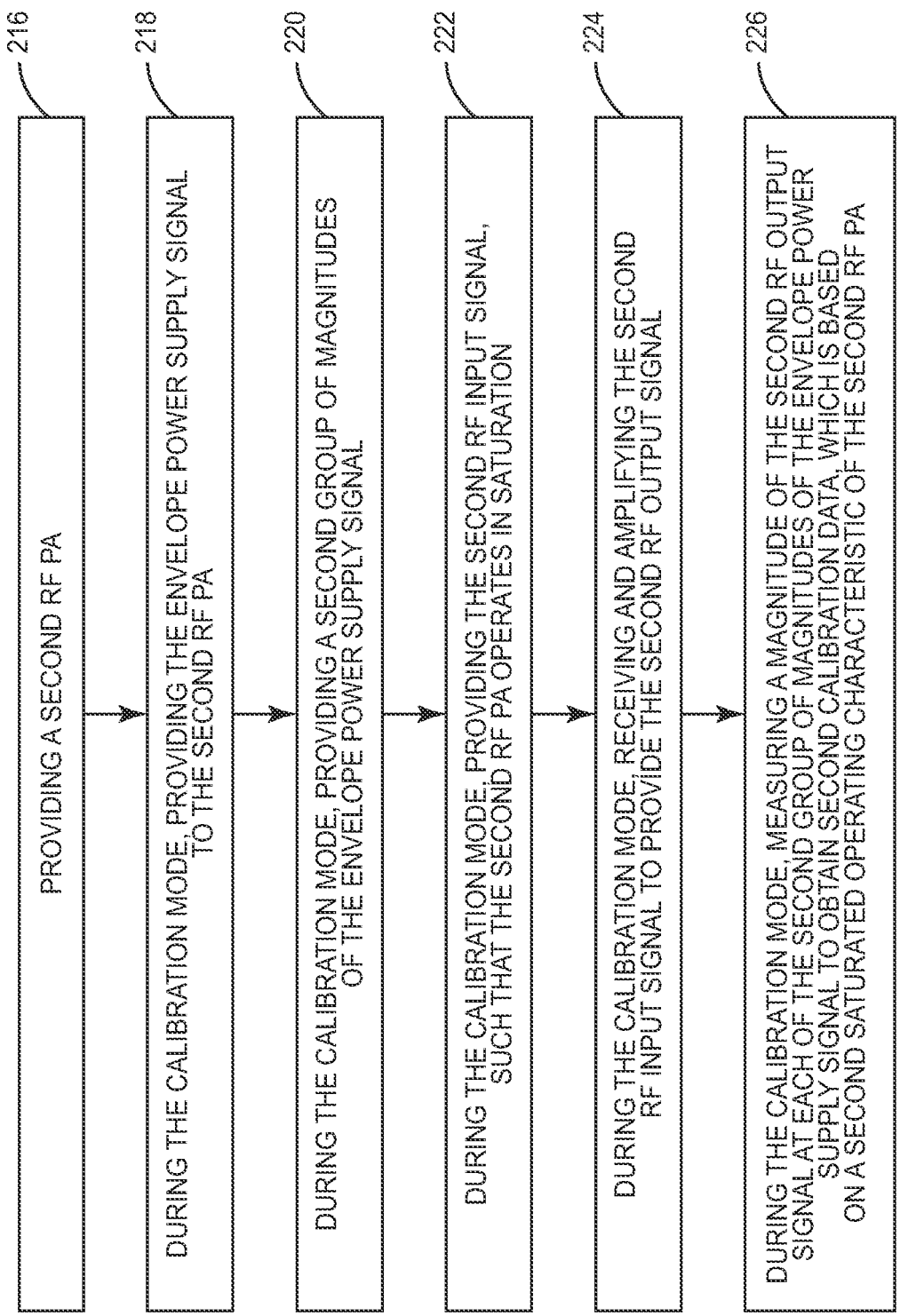
FIG. 17 illustrates a process for obtaining the second calibration data according to one embodiment of the present disclosure.

FIG. 17 illustrates a process for obtaining the second calibration data according to one embodiment of the present disclosure. The process may be associated either of the calibration configurations illustrated in FIG. 14 or FIG. 15. The process begins by providing the second RF PA 54 (Step 216). During the normal operation mode, the second RF PA 54 may receive and amplify the second RF input signal SRFI to provide the second RF output signal SRFO; receive the envelope power supply signal EPS, which may provide power for amplification to the second RF PA 54; and operate in one of multiple communications modes, such that the envelope power supply signal EPS has a minimum allowable magnitude based on a second saturated operating constraint, the one of the multiple communications modes, and a desired magnitude of the second RF input signal SRFI.

The process continues by during the calibration mode, providing the envelope power supply signal EPS to the second RF PA 54 (Step 218), followed by during the calibration mode, providing a second group of magnitude of the envelope power supply signal EPS (Step 220), which is followed by during the calibration mode, providing the second RF input signal SRFI, such that the second RF PA 54 operates in saturation (Step 222). In general, the input power to the second RF PA 54 may be controlled by controlling the second RF input signal SRFI, such that the second RF PA 54 remains sufficiently saturated while the envelope power supply signal EPS is varied. The envelope power supply signal EPS may be varied though its operating range. Further, the envelope power supply signal EPS may be swept through its operating range. The second RF input signal SRFI may be a constant power CW signal, a modulated GMSK signal, or some other signal that keeps the second RF PA 54 in sufficient saturation.

The process continues by during the calibration mode, receiving and amplifying the second RF input signal SRFI to provide the second RF output signal SRFO (Step 224). This step may typically be performed by the second RF PA 54. The process completes by during the calibration mode, measuring a magnitude of the second RF output signal SRFO at each of the second group of magnitudes of the envelope power supply signal EPS to obtain the second calibration data, which is based on a second saturated operating characteristic of the second RF PA 54 (Step 226). In an alternate embodiment of the process for obtaining the second calibration data, the process includes the additional step of during the calibration mode, providing the RF PA circuitry 30, the DC-DC converter 32, the transceiver circuitry 34, and the front-end aggregation circuitry 36 having the antenna port AP, such that the measuring the magnitude of the second RF output signal SRFO is via the antenna port AP. In an additional embodiment of the process for obtaining the second calibration data, any of the process steps may be omitted, additional process steps may be added, or both.

Figure 18:
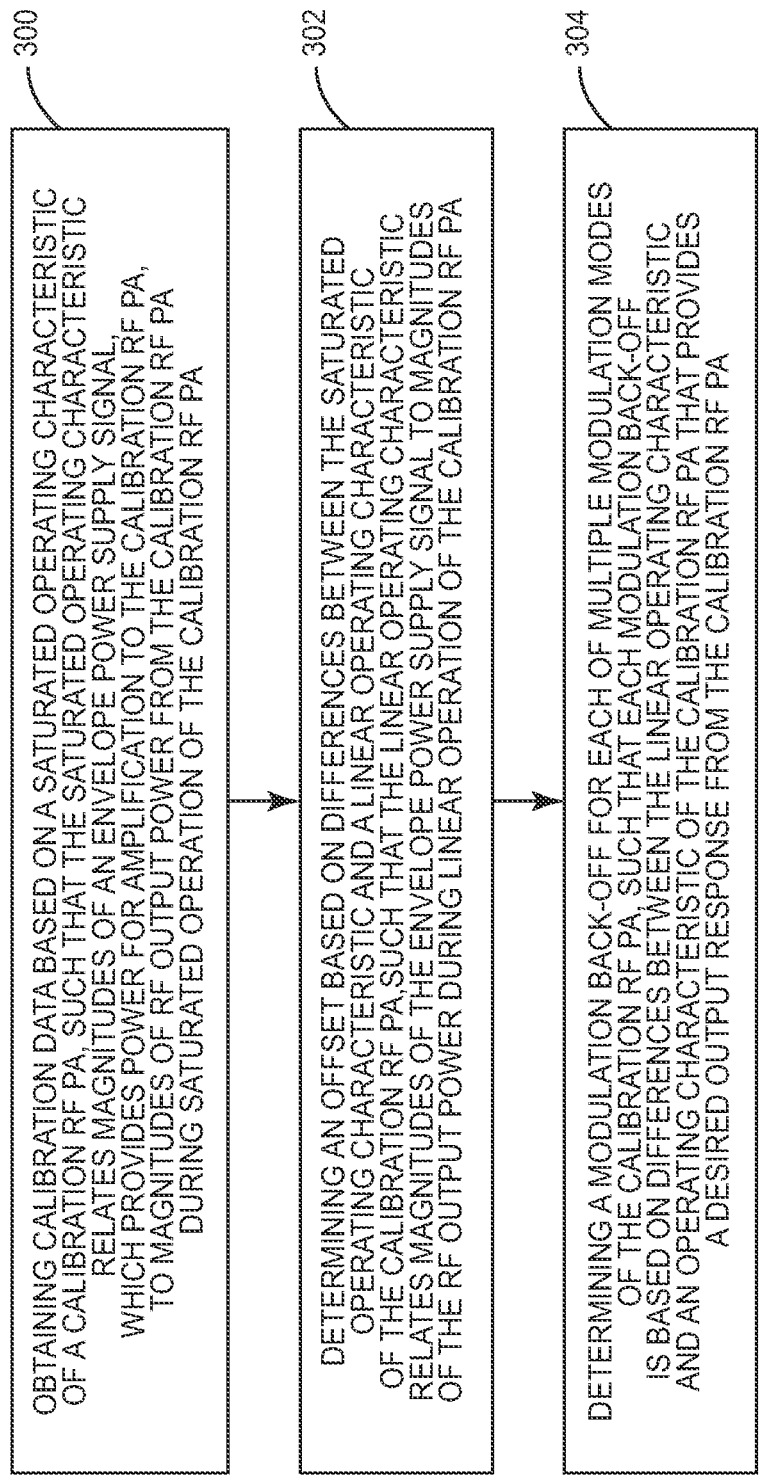
FIG. 18 illustrates a process for determining an offset and a modulation back-off of a calibration RF PA according to one embodiment of the present disclosure.

FIG. 18 illustrates a process for determining the offset 90 (FIG. 12) and a modulation back-off, such as the first modulation back-off 100 (FIG. 12) or the second modulation back-off 102 (FIG. 12), of a calibration RF PA, such as the first RF PA 50, the second RF PA 54, or a surrogate RF PA. The process begins by obtaining calibration data based on a saturated operating characteristic of the calibration RF PA, such that the saturated operating characteristic relates magnitudes of the envelope power supply signal EPS, which provides power for amplification to the calibration RF PA, to magnitudes of RF output power POUT from the calibration RF PA during saturated operation of the calibration RF PA (Step 300). The process continues by determining an offset 90 based on differences between the saturated operating characteristic and a linear operating characteristic of the calibration RF PA, such that the linear operating characteristic relates magnitudes of the envelope power supply signal EPS to magnitudes of the RF output power POUT during linear operation of the calibration RF PA (Step 302). The process completes by determining a modulation back-off for each of multiple modulation modes of the calibration RF PA, such that each modulation back-off is based on differences between the linear operating characteristic and an operating characteristic of the calibration RF PA that provides a desired output response from the calibration RF PA (Step 304).

In an alternate embodiment of the process for obtaining the offset 90 and the modulation back-off, the desired output response from the calibration RF PA provides a desired output frequency spectrum response from the calibration RF PA. In another embodiment of the process for obtaining the offset 90 and the modulation back-off, the desired output response from the calibration RF PA provides a desired linearity response from the calibration RF PA. In a further embodiment of the process for obtaining the offset 90 and the modulation back-off, the desired output response from the calibration RF PA provides a desired error vector magnitude (EVM) response from the calibration RF PA. In an additional embodiment of the process for obtaining the offset 90 and the modulation back-off, any of the process steps may be omitted, additional process steps may be added, or both.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:

obtaining calibration data corresponding with a saturated operating characteristic of a calibration radio frequency (RF) power amplifier (PA), such that the saturated operating characteristic relates magnitudes of an envelope power supply signal, which provides power for amplification to the calibration RF PA, to magnitudes of RF output power from the calibration RF PA during saturated operation of the calibration RF PA;

applying an offset to the saturated operating characteristic to obtain a linear operating characteristic of the calibration RF PA, such that the linear operating characteristic relates magnitudes of the envelope power supply signal to magnitudes of the RF output power during linear operation of the calibration RF PA; and determining a modulation back-off for each of a plurality of modulation modes of the calibration RF PA, such that each modulation back-off is based on differences between the linear operating characteristic and an operating characteristic of the calibration RF PA that provides a desired output response from the calibration RF PA.

2. The method of claim 1 wherein the desired output response from the calibration RF PA provides a desired output frequency spectrum response from the calibration RF PA.

3. The method of claim 1 wherein the desired output response from the calibration RF PA provides a desired linearity response from the calibration RF PA.

4. The method of claim 1 wherein the desired output response from the calibration RF PA provides a desired error vector magnitude (EVM) response from the calibration RF PA.

* * * * *